US009697988B2

(12) United States Patent
Wan et al.

(10) Patent No.: US 9,697,988 B2
(45) Date of Patent: Jul. 4, 2017

(54) ION IMPLANTATION SYSTEM AND PROCESS

(71) Applicant: Advanced Ion Beam Technology, Inc., Hsinchu (TW)

(72) Inventors: Zhimin Wan, Sunnyvale, CA (US); Kourosh Saadatmand, Danvers, MA (US); Nicholas White, Manchester, MA (US)

(73) Assignee: Advanced Ion Beam Technology, Inc., Hsinchu (TW)

( * ) Notice: Subject to any disclaimer, the term of this patent is extended or adjusted under 35 U.S.C. 154(b) by 0 days.

(21) Appl. No.: 14/883,538

(22) Filed: Oct. 14, 2015

(65) Prior Publication Data

US 2017/0110287 A1    Apr. 20, 2017

(51) Int. Cl.
*H01J 37/00* (2006.01)
*H01J 37/30* (2006.01)

(52) U.S. Cl.
CPC . *H01J 37/3007* (2013.01); *H01J 2237/31701* (2013.01)

(58) Field of Classification Search
CPC .................. H01J 37/3007; H01J 2237/31701
USPC ........................................ 250/492.1–492.3
See application file for complete search history.

(56) References Cited

U.S. PATENT DOCUMENTS

| 3,955,091 | A | 5/1976 | Robinson et al. |
| 4,871,918 | A | 10/1989 | Miljevic |
| 4,933,551 | A | 6/1990 | Bernius et al. |
| 5,350,926 | A * | 9/1994 | White ................. H01J 37/3171 250/251 |
| 2002/0109099 | A1 | 8/2002 | White et al. |
| 2003/0080689 | A1 | 5/2003 | Whaley |
| 2004/0104682 | A1 | 6/2004 | Horsky et al. |
| 2005/0173656 | A1 | 8/2005 | Kaim et al. |
| 2006/0091776 | A1 | 5/2006 | Munehiro et al. |
| 2007/0228922 | A1 | 10/2007 | Nakasuji |
| 2007/0278417 | A1 | 12/2007 | Horsky et al. |
| 2008/0067377 | A1 | 3/2008 | Hatakeyama et al. |
| 2009/0189096 | A1 * | 7/2009 | Chen ....................... H01J 37/08 250/492.21 |
| 2010/0026161 | A1 | 2/2010 | Iijima et al. |

(Continued)

OTHER PUBLICATIONS

Non Final Office Action received for U.S. Appl. No. 14/519,080, mailed on Mar. 16, 2016, 23 pages.

*Primary Examiner* — Michael Maskell
(74) *Attorney, Agent, or Firm* — Morrison & Foerster LLP

(57) ABSTRACT

Ion implantation systems and processes are disclosed. An exemplary ion implantation system may include an ion source, an extraction manipulator, a magnetic analyzer, and an electrode assembly. The extraction manipulator may be configured to generate an ion beam by extracting ions from the ion source. A cross-section of the generated ion beam may have a long dimension and a short dimension orthogonal to the long dimension of the ion beam. The magnetic analyzer may be configured to focus the ion beam in an x-direction parallel to the short dimension of the ion beam. The electrode assembly may be configured to accelerate or decelerate the ion beam. One or more entrance electrodes of the electrode assembly may define a first opening and the electrode assembly may be positioned relative to the magnetic analyzer such that the ion beam converges in the x-direction as the ion beam enters through the first opening.

40 Claims, 12 Drawing Sheets

(56) References Cited

U.S. PATENT DOCUMENTS

| | | |
|---|---|---|
| 2010/0044580 A1 | 2/2010 | Boswell et al. |
| 2011/0291545 A1 | 12/2011 | Durand et al. |
| 2012/0097861 A1* | 4/2012 | White .................. H01J 3/04 |
| | | 250/397 |
| 2015/0340202 A1* | 11/2015 | Matsushita ......... H01J 37/3171 |
| | | 250/492.21 |

* cited by examiner

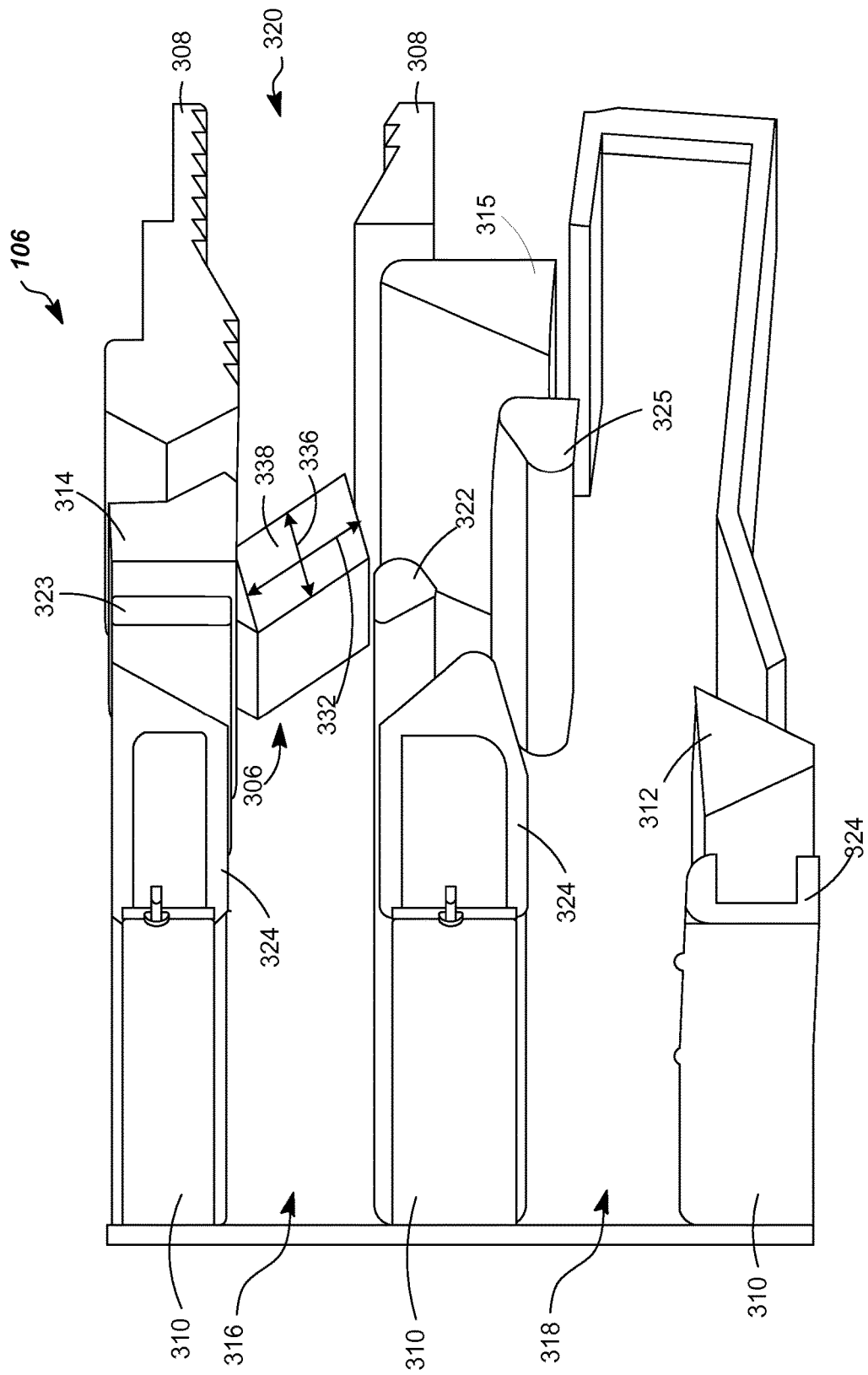

ION IMPLANTATION SYSTEM AND PROCESS

BACKGROUND

1. Field

The present disclosure relates generally to ion implantation, and more particularly, to systems and processes for ion implantation.

2. Related Art

In semiconductor device fabrication, the physical and/or electrical properties of materials may be modified through a process known as ion implantation. Ion implantation may be performed using an ion implantation system. In an ion implantation system, an ion beam may be generated from an ion source. The shape, angle, and uniformity of the ion beam may be manipulated using various components of the ion implantation system prior to directing the ion beam onto a work piece (e.g., a semiconductor substrate). Conventional ion implantation systems may frequently suffer from poor transmission through the various components of the ion implantation system, which may result in an inefficient ion implantation process and high cost of ownership. Further, the ion beam may be susceptible to space charge effects, and more specifically, space charge blow-up as the ion beam is guided through the ion implantation system. This may cause difficulties in precisely controlling the shape, angle, and uniformity of the ion beam. Such imprecise control of the ion beam may be undesirable during semiconductor device fabrication.

BRIEF SUMMARY

Ion implantation systems and processes are disclosed. An exemplary ion implantation system may include an ion source, an extraction manipulator, a magnetic analyzer, and an electrode assembly. The extraction manipulator may be configured to generate an ion beam by extracting ions from the ion source. A cross-section of the ion beam may have a long dimension and a short dimension orthogonal to the long dimension of the ion beam. The magnetic analyzer may be configured to focus the ion beam in an x-direction parallel to the short dimension of the ion beam. The electrode assembly may be configured to accelerate or decelerate the ion beam. One or more entrance electrodes of the electrode assembly may define a first opening and the electrode assembly may be positioned relative to the magnetic analyzer such that the ion beam converges in the x-direction as the ion beam enters through the first opening.

In some examples, the magnetic analyzer may be configured to focus the ion beam in the x-direction parallel to the short dimension of the ion beam. The ion source and the extraction manipulator may be positioned relative to the magnetic analyzer such that the generated ion beam enters the magnetic analyzer at an angle of incidence of approximately 2-8 degrees relative to a central axis of the magnetic analyzer.

In some examples, the magnetic analyzer may include a yoke and the generated ion beam may enter the magnetic analyzer through an opening of the yoke. The ion source and the extraction manipulator may be configured such that at least approximately 90% of the generated ion beam is transmitted through the opening of the yoke.

In some examples, the one or more entrance electrodes of the electrode assembly may be disposed at a first side of the electrode assembly. The electrode assembly may further include a pair of exit electrodes disposed at a second side of the electrode assembly opposite to the first side. The pair of exit electrodes may define a second opening. The pair of exit electrodes may be positioned on opposite sides of a first plane aligned with a first dimension of the second opening. The electrode assembly may further include a pair of Pierce electrodes adjacent to the pair of exit electrodes. The pair of Pierce electrodes may be positioned on opposite sides of a second plane aligned with a second dimension of the second opening. The second dimension of the second opening may be perpendicular to the first dimension of the second opening. The pair of Pierce electrodes may partially define a first ion beam path that extends from the first opening to the second opening. Each Pierce electrode of the pair of Pierce electrodes may have an angled surface facing the first ion beam path. The angled surface of each Pierce electrode may be positioned such that a first dimension of the angled surface of each Pierce electrode forms an angle of between approximately 40 and 80 degrees with respect to the second plane.

BRIEF DESCRIPTION OF THE DRAWINGS

FIG. 3B illustrates a cross-sectional, three-dimensional perspective view of an electrode assembly, according to various examples.

DETAILED DESCRIPTION

Figure 1A:
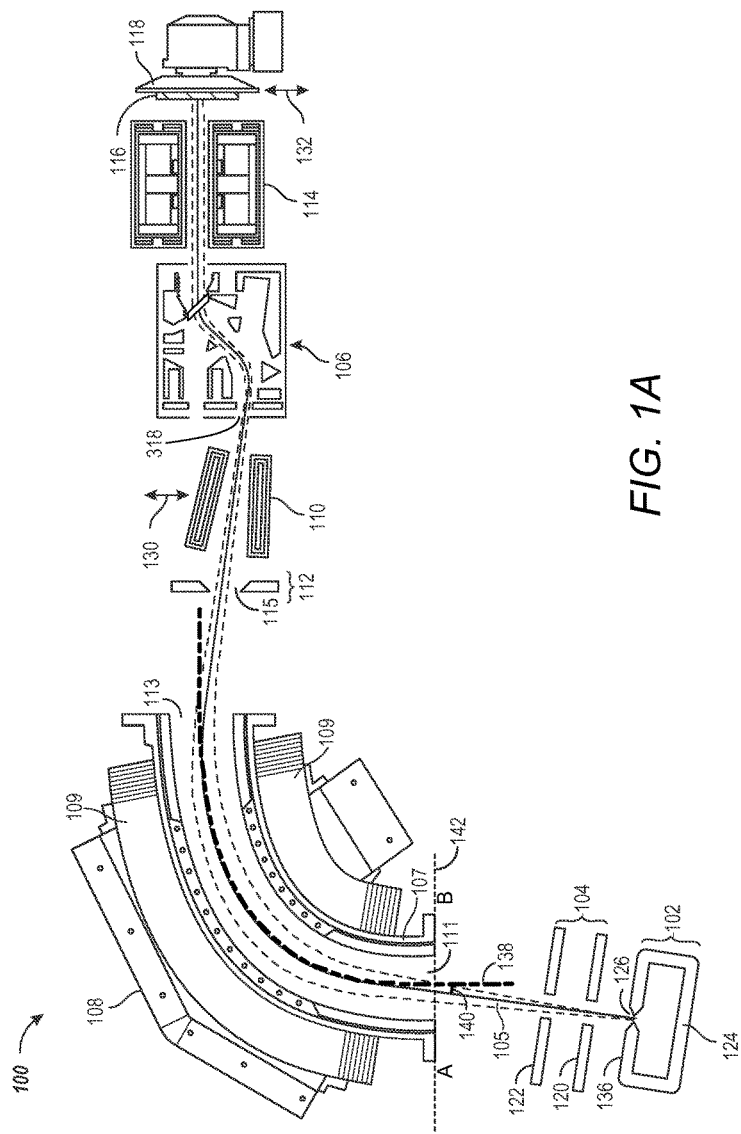
FIGS. 1A-B illustrate an ion implantation system, according to various examples.

The following description is presented to enable a person of ordinary skill in the art to make and use the various embodiments. Descriptions of specific systems, devices, methods, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

In one embodiment, an ion implantation system may include an ion source, an extraction manipulator, a magnetic analyzer, and an electrode assembly. The extraction manipulator may be configured to generate an ion beam by extracting ions from the ion source. A cross-section of the ion beam may have a long dimension and a short dimension orthogonal to the long dimension of the ion beam. The magnetic analyzer may be configured to focus the ion beam in an x-direction parallel to the short dimension of the ion beam. The electrode assembly may be configured to accelerate or decelerate the ion beam. One or more entrance electrodes of the electrode assembly may define a first opening and the electrode assembly may be positioned relative to the magnetic analyzer such that the ion beam converges in the x-direction as the ion beam enters through the first opening. Configuring the system such that the ion beam converges as it enters through the first opening may reduce the overall divergence of the ion beam through the electrode assembly, which may reduce space charge blow-up of the beam. This may be desirable for increasing the transmission of the ion beam through the electrode assembly. In some examples, the ion source and the extraction manipulator may be positioned relative to the magnetic analyzer such that the generated ion beam enters the magnetic analyzer at an angle of incidence of approximately 2-8 degrees relative to a central axis of the magnetic analyzer. Such a configuration may increase the focal length of the ion beam exiting the magnetic analyzer and facilitate the convergence of the ion beam as it enters through the first opening of the electrode assembly.

In some examples, the electrode assembly may further include a pair of Pierce electrodes for controlling space charge effects. The pair of Pierce electrodes may be adjacent to a pair of exit electrodes of the electrode assembly that define a second opening. The pair of exit electrodes may be positioned on opposite sides of a first plane aligned with a first dimension of the second opening. The pair of Pierce electrodes may be positioned on opposite sides of a second plane aligned with a second dimension of the second opening. The second dimension of the second opening may be perpendicular to the first dimension of the second opening. The pair of Pierce electrodes may partially define a first ion beam path that extends from the first opening to the second opening. Each Pierce electrode of the pair of Pierce electrodes may have an angled surface facing the first ion beam path. The angled surface of each Pierce electrode may be positioned such that a first dimension of the angled surface of each Pierce electrode forms an angle of between approximately 40 and 80 degrees with respect to the second plane. The pair of Pierce electrodes may be configured to generate an electric field that resists divergence of the ion beam as it exits the electrode assembly. This may be desirable for reducing the space charge effects in the ion beam.

Conventionally, Pierce electrodes may be implemented as extraction electrodes to extract a collimated electron beam from an electron source. The electron source may contain a pool of ultra-low energy electrons (e.g., less than approximately 20 eV). During the extraction of an electron beam, a potential difference may be applied between the extraction electrodes and the electron source to extract electrons from the electron source and accelerate the electrons to a desired energy. For such extraction electrodes, a unique solution may be derived to determine the shape and position of the extraction electrodes. However, this solution may not be applicable to the Pierce electrodes implemented in an electrode assembly of an ion implantation system. This may be because ions used in ion implantation have mass-to-charge ratios that are significantly greater than that of electrons. Further, unlike an electron beam, the ion beam of an ion implantation system may include various different ion species having different masses. Therefore, the shape and position of extraction electrodes used in extracting an electron beam may not be suitably implemented in an electrode assembly of an ion implantation system. In fact, implementing such extraction electrodes in an electrode assembly of an ion implantation system may yield undesirable results.

Figure 1B:
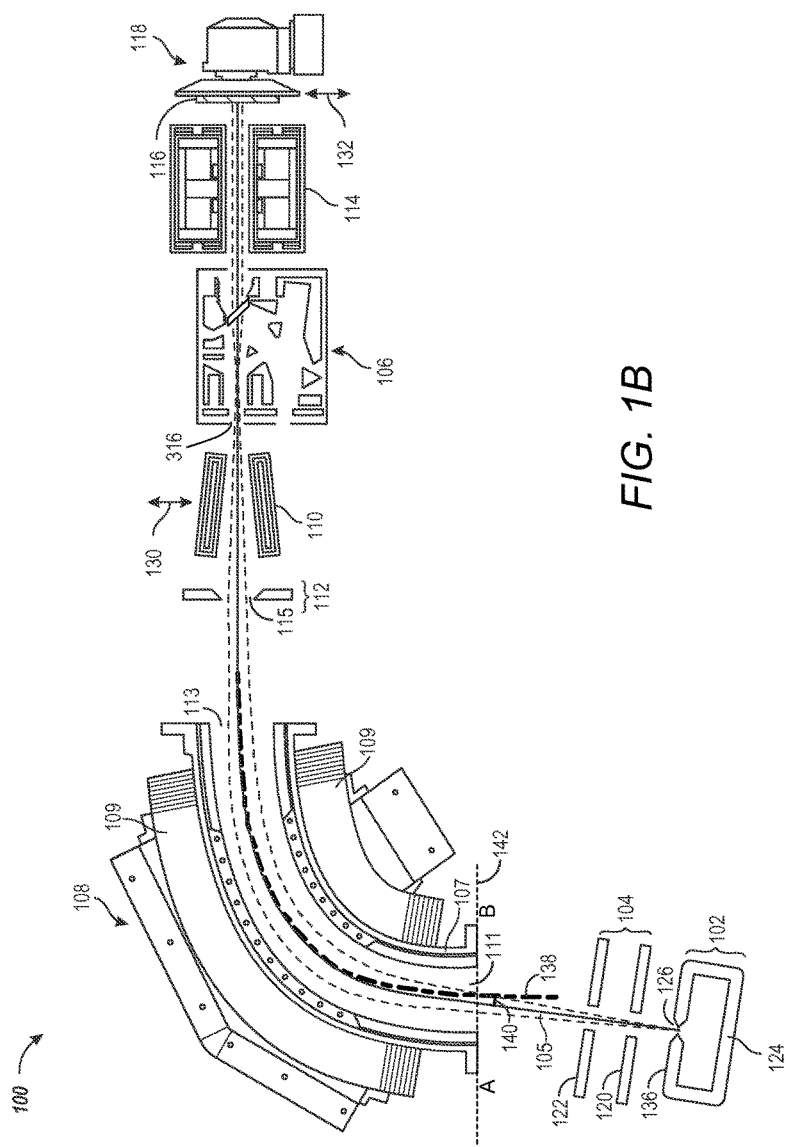

FIGS. 1A-B illustrate ion implantation system 100, according to various examples. System 100 may include ion source 102 and extraction manipulator 104 for generating ion beam 105. Extraction manipulator 104 may extract ion beam 105 from ion source 102 and direct ion beam 105 into magnetic analyzer 108 where ion beam 105 may be filtered by mass, charge, and energy. Ion beam 105 may be further directed through multipole magnets 110, electrode assembly 106, and multipole magnets 114 to adjust the energy, shape, direction, angle, and uniformity of ion beam 105. In particular, electrode assembly 100 may be configured to adjust the energy of ion beam 105, remove neutral species from ion beam 105, and adjust the size, shape, and uniformity of ion beam 105. Multipole magnets 110 and 114 may be configured to adjust the uniformity, center angle, and divergence angle of ion beam 105. Variable aperture assembly 112 may be positioned between multipole magnets 110 and magnetic analyzer 108. Variable aperture assembly may be configured to adjust the ion current of ion beam 105. System 100 may further include work piece support structure 118, which may be configured to position work piece 116 in the path of ion beam 105, thereby causing implantation of ions into work piece 116.

Ion source 102 may be configured to generate ions of a desired species. For example, for semiconductor device fabrication, desired ion species may include boron, phosphorus, or arsenic (e.g., B+, P+, and As+). In some examples, ion source 102 may comprise a Bernas source, a Freeman source, or an indirectly heated cathode source. Ion source 102 may include arc chamber 124 that may be configured to receive one or more process gases from one or more gas sources (not shown). Ion source 102 may be configured to form a plasma in arc chamber 124 by electron ionization of the one or more process gases. In this example, ion source 102 may include a cathode (not shown) disposed within arc chamber 124. The cathode may include a filament that may be heated to generate electrons for ionizing the one or more process gases. The cathode may be coupled to a power source (not shown), which may bias the cathode at an arc voltage to accelerate the electrons from the cathode to the sidewalls of arc chamber 124. The energized electrons may ionize the one or more process gases in arc chamber 124, thereby forming a plasma in arc chamber 124.

Ion source 102 may include faceplate 136 on one side of arc chamber 124. Faceplate 136 may include exit aperture 126 (e.g., arc slit) through which ions extracted from ion source 102 may exit arc chamber 124. In this example, exit aperture 126 may be a slit or a slot configured to form a ribbon-shaped ion beam 105. In particular, exit aperture 126 may be elongated (e.g., a rectangular or elliptical shape) with a long dimension and a short dimension that is perpendicular to the long dimension. For example, long dimension of exit aperture 126 may be approximately 70-150 mm while short dimension of exit aperture may be approximately 3.0-5.5 mm. As shown in FIGS. 1A-B, the edges of exit aperture 126 can be tapered to form a sharp edge to facilitate the generation of ion beam 105. In some examples, the tip of the sharp edge may be rounded to reduce the formation of particles and flakes and thus increase the ion source life. In particular, the radius of the rounded edge may be between approximately 0.2-0.8 mm, 0.4-0.8 mm or 0.4-0.6 mm. Faceplate 136 may be coupled to a power source (not shown) to bias faceplate 136, thereby creating a potential difference (e.g., extraction voltage) between ion source 102 and extraction manipulator 104 to generate ion beam 105.

Extraction manipulator 104 may include suppression electrode 120 and ground electrode 122. Suppression electrode 120 may be configured to resist electrons from backflowing into ion source 102. In particular, a power supply (not shown) may be coupled to suppression electrode 120 to apply a suppression voltage to suppression electrode 120. Ground electrode 122 may be coupled to a ground potential. It should be recognized that, in other examples, extraction manipulator 104 may include additional electrodes that may be biased using one or more power supplies. Extraction manipulator 104 may be configured to generate an ion beam by extracting ions from ion source 102. In particular, suitable voltages may be applied to faceplate 136 and ground electrode 122 to generate a potential difference between faceplate 136 and ground electrode 122. The generated potential difference may cause ions to be extracted from arc chamber 124 through exit aperture 126 and accelerated through ground electrode 122 to generate ion beam 105.

The cross-section of ion beam 105 may have a long dimension and short-dimension that is orthogonal to the long dimension of ion beam 105. The long dimension of ion beam 105 may be parallel to the y-direction of ion beam 105 while the short dimension of ion beam 105 may be parallel to the x-direction of ion beam 105. In FIGS. 1A-B, the x-direction of ion beam 105 may be parallel to the plane of the drawing and orthogonal to the direction of travel of ion beam 105 while the y-dimension of ion beam 105 may be orthogonal to the plane of the drawing and orthogonal to the direction of travel of ion beam 105. In some examples, the long dimension of ion beam 105 may be at least twice as large as the short dimension of ion beam 105. As shown in FIGS. 1A-B, ion beam 105 may diverge in the x-direction as it travels from extraction manipulator 104 to magnetic analyzer 108. Further, ion beam 105 may be directed along a linear trajectory from extraction manipulator 104 to magnetic analyzer 108.

Magnetic analyzer 108 may include yoke 107 and electromagnetic coils 109 wrapped around opposite sidewalls of yoke 107. Yoke 107 may define a channel through which ion beam 105 travels through magnetic analyzer 108. Ion beam 105 may enter magnetic analyzer 108 through first opening 111 of yoke 107 and exit magnetic analyzer 108 through second opening 113 of yoke 107. Magnetic analyzer 108 may be configured to generate a magnetic field that causes ion beam 105 to deflect in a particular direction (e.g., the x-direction). While being deflected, the ions in ion beam 105 may be filtered according to energy and mass-to-charge ratio such that only ions having a desired energy and mass-to-charge ratio may pass through magnetic analyzer 108 toward work piece 116. Further, the generated magnetic field may focus ion beam 105 in an x-direction parallel to the short dimension of ion beam 105. As shown in FIGS. 1A-B, ion beam 105 may diverge in the x-direction as it enters magnetic analyzer 108 through first opening 111 of yoke 107 and may be focused by the generated magnetic field to converge in the x-direction as it exits magnetic analyzer 108 through second opening 113 of yoke 107.

In some examples, ion source 102 and extraction manipulator 104 may be positioned relative to magnetic analyzer 108 such that ion beam 105 enters the magnetic analyzer at angle of incidence 140 relative to central axis 138 of magnetic analyzer 108 at opening 111. In particular, ion beam 105 entering opening 111 may be angled with respect to central axis 138 toward the same direction in which ion beam 105 is deflected by the magnetic field. For example, as shown in FIGS. 1A-B, ion beam 105 may be proximate to the side of opening 111 labeled "A" rather than the side of opening 111 labeled "B" as it enters magnetic analyzer 108 at angle of incidence 140. Thus, ion beam 105 may not be perpendicular to the magnetic field generated by magnetic analyzer 108 as ion beam 105 enters opening 111. Directing ion beam 105 into magnetic analyzer 108 in this manner may increase the focal length of ion beam 105 exiting from magnetic analyzer 108, which may enhance beam control, prevent beam blow-up, and increase transmittance of ion beam 105 through electrode assembly 106.

Angle of incidence 140 may refer to the angle between the center of ion beam 105 (depicted as a solid line in FIGS. 1A-B) and central axis 138 of magnetic analyzer 108 at opening 111. Central axis 138 may be positioned equidistant between opposite inner side walls of yoke 107 and equidistant between the top inner wall and bottom inner wall of yoke 107. In some examples, angle of incidence 140 of ion beam 105 may be defined with respect to plane 142 aligned with opening 111 of yoke 107. Plane 142 may be parallel to the magnetic field generated by magnetic analyzer 108 within yoke 107. Further, plane 142 may be approximately aligned with the effective fringe magnetic field boundary at opening 111 of yoke 107. In these examples, angle of incidence 140 may refer to the angle between the center of ion beam 105 and a reference axis perpendicular to plane 142 at opening 111. In some examples, angle of incidence 140 may be greater than approximately 2 degrees. In other examples, angle of incidence 140 may be approximately 2-8 degrees or 4-6 degrees.

Figure 2:
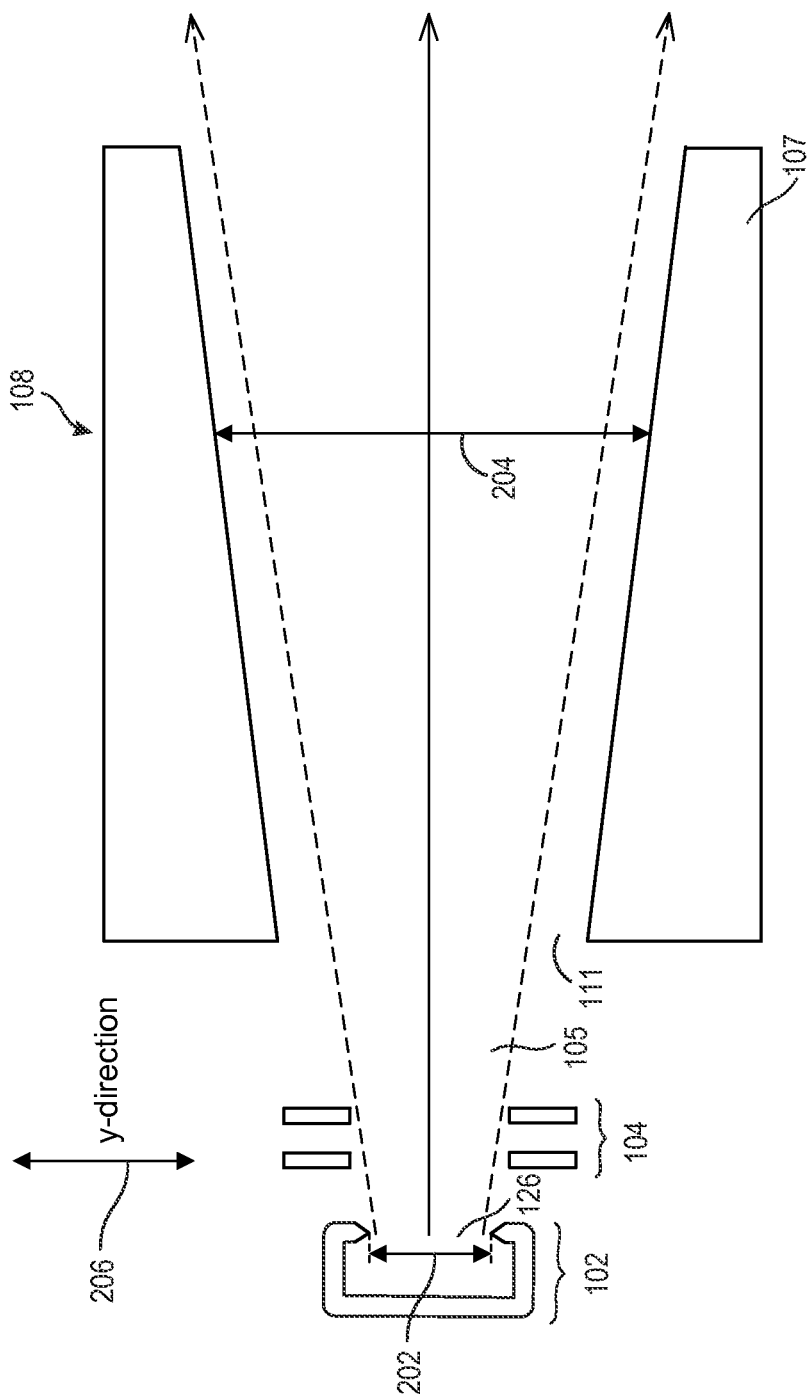
FIG. 2 illustrates a cross-sectional view of an ion source, an extraction manipulator, and a magnetic analyzer with respect to the y-direction of the ion beam, according to various examples.

FIG. 2 illustrates cross-sectional views of ion source 102, extraction manipulator 104, and magnetic analyzer 108 with respect to y-direction 206 of ion beam 105, according to various examples. For simplicity, the curved longitudinal path through yoke 107 is depicted linearly. As shown, ion beam 105 may diverge in y-direction 206 as it travels from ion source 102 to magnetic analyzer 108. In some examples, ion beam 105 may have a divergence angle in the y-direction that is greater than approximately 2.5 degrees at opening 111 of the yoke. In particular, the divergence angle may be approximately 3.0-4.0 degrees or 3.3-3.7 degrees. Further, as shown in FIG. 2, ion beam 105 may diverge in y-direction 206 as it enters opening 111 and may continue to diverge in the y-direction as it travels through the channel of yoke 107. Yoke 107 may be configured to allow for such divergence. In particular, height 204 of the channel may increase along the length of the channel of yoke 107. As shown in FIG. 2, height 204 of the channel may be parallel to the long dimension of ion beam 105.

The long dimension of ion beam 105 at opening 111 of yoke 107 may depend on long dimension 202 of exit aperture 126 and the divergence angle of ion beam 105. In particular, the long dimension of ion beam 105 may increase with a larger long dimension 202 of exit aperture 126 and a larger divergence angle of ion beam 105. In some examples, ion source 102 and extraction manipulator 104 may be configured such that at least approximately 90% (or in some examples, at least approximately 95%) of ion beam 105 is transmitted through opening 111 of yoke 107. More specifically, long dimension 202 of exit aperture 126 may be sufficiently small (e.g., less than approximately 100 mm, 70-90 mm, 75-85 mm, or 78-87 mm) such that a large percentage (e.g., at least approximately 90% or at least approximately 95%) of ion beam 105 is transmitted through opening 111. Ion beam 105 having too large of a long dimension may result in the ends of ion beam 105 impinging into and being absorbed by yoke 107. This may reduce the efficiency of the ion implantation system. At the same time, the long dimension of ion beam 105 may be sufficiently large at opening 111 such that the long dimension of ion beam 105 is greater than the diameter of work piece 116 (e.g., greater than approximately 300 mm) at work piece support structure 118. This increases throughput and improves dopant uniformity. In some examples, long dimension 202 of exit aperture 126 may be configured to achieve such a transmission.

With reference back to FIGS. 1A-B, magnetic analyzer 108 may be configured to focus ion beam 105 such that ion beam 105 continually converges in the x-direction as it travels from magnetic analyzer 108 to electrode assembly 106. In particular, magnetic analyzer 108 may direct ion beam 105 along a linear path from opening 113 to electrode assembly 106. As shown, magnetic analyzer 108 may direct ion beam 105 along one of two linear paths. With reference to FIG. 1A, magnetic analyzer 108 may direct ion beam 105 along a first linear path into opening 318 of electrode assembly 106 such that ion beam 105 travels through electrode assembly 106 along a first ion beam path (e.g., ion beam path 302, shown in FIG. 3A) of electrode assembly 106. Alternatively, as shown in FIG. 1B, magnetic analyzer 108 may direct ion beam 105 along a second linear path into opening 316 of electrode assembly 106 such that ion beam 105 travels through electrode assembly 106 along a second ion beam path (e.g., ion beam path 304, shown in FIG. 3A) of electrode assembly 106.

Electrode assembly 106 may include multiple electrodes configured to accelerate or decelerate ion beam 105. One or more entrance electrodes (e.g., terminal electrode(s) 310) of electrode assembly 106 may define openings 316 and 318 of electrode assembly 106. Electrode assembly 106 may be positioned relative to magnetic analyzer 108 such that ion beam 105 continues to converge in the x-direction as ion beam 105 enters through openings 316 or 318. In particular, the focal point of ion beam 105 may be positioned within electrode assembly 106. The focal point of ion beam 105 may be the point at which the short dimension of ion beam 105 reaches a minimum value as it converges from magnetic analyzer 108 to electrode assembly 106. In particular, the focal point may be the point at which the short dimension of ion beam 105 no longer converges and the point after which the short dimension of ion beam 105 begins to diverge. Additional description regarding the position of the focal point within electrode assembly 106 is provided below with reference to FIG. 3A.

It should be recognized that the position of the focal point of ion beam 105 with respect to electrode assembly 106 may be governed predominantly by the position of electrode assembly 106 relative to magnetic analyzer 108. In particular, the focal length and thus the focal point of ion beam 105 may not be significantly changed by adjusting process conditions. For example, adjusting the magnetic field of magnetic analyzer 108 may alter the extent to which ion beam 105 is deflected, but may not significantly alter the focal length of ion beam 105 (and thus the position of the focal point). Additionally, changing the extraction gap between ion source 102 and extraction manipulator 104 may only slightly alter the focal length of ion beam 105. In particular, the range of the extraction gap may not be sufficient to move the focal point from outside of electrode assembly 106 to within electrode assembly 106. Using the extraction gap to significantly alter the focal length of ion beam 105 may also be undesirable because it reduces the beam tuning capabilities associated with the extraction gap. This may restrict the energy and current range of ion beam 105. In the present example, electrode assembly 106 may be positioned relative to magnetic analyzer 108 such that ion beam 105 converges to a focal point within electrode assembly while extraction manipulator 104 is at a middle position (e.g., the middle position between the closest and farthest positions that extraction manipulator 104 may be moved with respect to ion source 102).

Positioning electrode assembly 106 relative to magnetic analyzer 108 such that the focal point of ion beam 105 is inside rather than outside (e.g., in front) of electrode assembly 106 may be counter-intuitive because it increases the length that ion beam 105 travels, which may increase ion loss due to interactions with residual gas. However, there are unexpected advantageous associated with positioning the focal point inside of electrode assembly 106. In particular, such a configuration reduces space charge ion beam blow-up within electrode assembly 106 and increases the transmission (e.g., by approximately 30%) of ion beam 105 through electrode assembly 106. This may increase the efficiency of the ion implantation process and reduce cost of ownership of the ion implantation system.

As shown in FIGS. 1A-B, ion beam 105 may be directed through variable aperture assembly 112 and multipole magnets 110 between magnetic analyzer 108 and electrode assembly 106. Variable aperture assembly 112 may include one or more movable plates that define variable aperture 115. The movable plates may be configured to adjust the size and shape of the variable aperture 115. The size and shape of the aperture may define the size and shape of ion beam 105 exiting variable aperture assembly 112. Further, variable aperture assembly 112 may adjust the ion current of ion beam 105 by adjusting the size of variable aperture 115. In particular, variable aperture 115 can be reduced to limit the ion current of ion beam 105 transmitted through variable aperture assembly 112. By adjusting the size of variable aperture, the ion current may be quickly adjusted between implant processes, thereby increasing throughput and productivity. In some examples, variable aperture assembly 112 may be configured to adjust the ion beam current from approximately 50 uA down to 10 uA (and in some examples down to approximately 5 uA). This may be particularly desirable for medium current ion implantation applications. Additional exemplary aspects of the variable aperture assembly are described in U.S. Pat. Nos. 8,198,610 and 8,669,539, both of which are incorporated herein by reference in their entirety.

Multipole magnets 110 may include an array of coils arranged on ferromagnetic supports. Electrical energy may be supplied to the array of coils to generate a contiguous magnetic field. In particular, multipole magnets 110 may be configured such that electrical energy may be independently supplied to the individual coils. This may enable the magnetic field gradient over the contiguous magnetic field to be adjusted. Thus, a suitable non-uniform magnetic field may be generated to adjust the size, shape, angle, and/or uniformity of ion beam 105. For example, a suitable magnetic field may be generated by multipole magnets 110 to control the size and current density of the ion beam 105. In doing so, multipole magnets 110 may be configured to adjust the shape of ion beam 105 as well as its spatial uniformity. Further, in some examples, multipole magnets 110 may be configured to generate a quadrupole magnetic field that may be suitable for adjusting the convergence or divergence angle (e.g., in the x-direction or the y-direction) of ion beam 105. It should be recognized however that, multipole magnets 110 may not be configured to substantially alter (e.g., more than 5 mm) the focal point of ion beam 105. In particular, multiple magnets 110 may not be configured to shift the focal point of ion beam 105 from outside of electrode assembly 106 to within electrode assembly 106. Further, in some examples, electrode assembly 106 may be positioned relative to magnetic analyzer 108 such that ion beam 105 converges in the x-direction as ion beam 105 enters through openings 316 or 318 without multipole magnets 110 substantially altering (e.g., more than 2 degrees) the convergence or divergence angle of ion beam 105.

In some examples, multipole magnets 110 may be configured to move along a track in a direction indicated by arrows 130. In this way, multipole magnets 110 may be positioned to receive ion beam 105 from magnetic analyzer 108 along each of the two linear paths described above. For example, as shown in FIG. 1A, multipole magnets 110 may be positioned to align with opening 318 of electrode assembly 106 when ion beam 105 is directed along the first linear path. Alternatively, as shown in FIG. 1B, multipole magnets 110 may be positioned to align with opening 316 of electrode assembly 106 when ion beam 105 is directed along the second linear path.

Figure 3A:
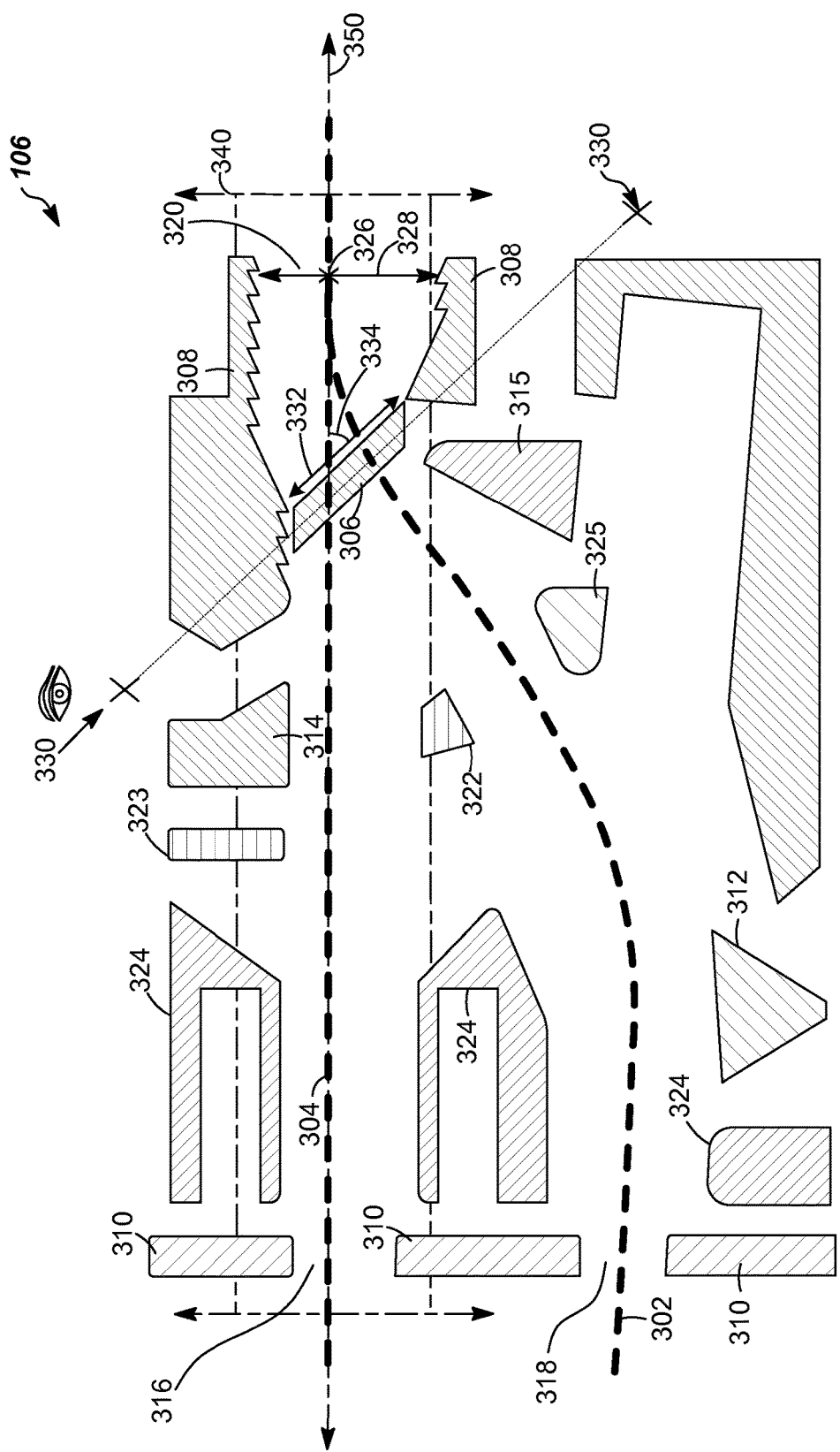
FIG. 3A illustrates a cross-sectional, two-dimensional view of an electrode assembly, according to various examples.

FIG. 3A illustrates a cross-sectional view of electrode assembly 106, according to various examples. FIG. 3B illustrates a perspective view of electrode assembly 106, according to various examples. Electrode assembly 106 may be configured to accelerate and/or decelerate an ion beam to control the energy of the ion beam. As shown in FIG. 3A, electrode assembly 106 may include ion beam paths 302 and 304 along which an ion beam may traverse electrode assembly 106. Ion beam paths 302 and 304 may be defined by multiple electrodes of electrode assembly 106. Ion beam path 302 may be a curvilinear path that extends from opening 318 to opening 320. Ion beam path 304 may be a linear path that extends from opening 316 to opening 320. Openings 316 and 318 may be defined by one or more terminal electrodes 310. Terminal electrodes 310 may also be referred to as entrance electrodes. In some examples, opening 316 may be aligned with respect to opening 320 such that ion beam path 304 has a straight trajectory that is approximately parallel to horizontal reference plane 350. Openings 316 and 318 may be referred to as entrance openings while opening 320 may be referred to as an exit opening. It should be recognized that in other examples, the shape and trajectory of ion beam paths 302 and 304 may vary.

As shown in FIGS. 3A-B, electrode assembly 106 may further include one or more terminal electrodes 310 and one or more suppression electrodes 324. Terminal electrodes 310 may define at least part of openings 316 and 318. Suppression electrodes 324 may be adjacent to terminal electrodes and may function to repel electrons in the ion beam from entering electrode assembly 106. For example, a negative voltage with respect to the potential of terminal electrodes 310 may be applied to suppression electrodes 324 to repel electrons from entering openings 316 and 318. In another example, a negative voltage with respect to ground potential may be applied to suppression electrodes 324 to repel electrons at the exit region near opening 320 from travelling upstream through electrode assembly 106 and through openings 316 and 318 toward magnetic analyzer 108.

Electrode assembly 106 may include multiple electrodes for manipulating the ion beam as the ion beam travels along ion beam path 302 or 304. In the present example, the electrodes of electrode assembly 106 may be configured to decelerate the ion beam as the ion beam travels along ion beam path 302. The ion beam may thus enter opening 318 at an initial energy and exit opening 320 at a final energy that is lower than the initial energy. Further, in this example, the electrodes of electrode assembly 106 may be configured to accelerate the ion beam or allow the ion beam to drift at constant velocity as the ion beam travels along ion beam path 304. Thus, the ion beam may enter opening 316 at an initial energy and may exit opening 320 at a final energy that is equal or greater than the initial energy. It should be recognized that, in other examples, the electrode assembly 106 may be configured to accelerate the ion beam as the ion beam travels along ion beam path 302 or decelerate the ion beam as the ion beam travels along ion beam path 304.

Electrode assembly 106 may include a pair of exit electrodes 308 that at least partially defines opening 320. In particular, as shown in FIGS. 3A-B, exit electrodes 308 may define a portion of ion beam path 302 or 304 adjacent to opening 320 and may be positioned on opposite sides of horizontal reference plane 350. Horizontal reference plane 350 may be aligned with first dimension 326 of opening 320. First dimension 326 may be represented by the symbol X in FIG. 3A. Horizontal reference plane 350 and first dimension 326 of opening 320 may both be perpendicular to the plane of the drawing in FIG. 3A. Exit electrodes 308 may be the final set of electrodes of electrode assembly 106 through which the ion beam passes prior to exiting electrode assembly 106. Exit electrodes 308 may be coupled to a ground potential and thus may be referred to as ground electrodes. Although in the present example, electrode assembly 106 is depicted as having a pair of exit electrodes 308, it should be recognized that in other examples, electrode assembly 106 may include any number of exit electrodes.

Electrode assembly 106 may further include a pair of Pierce electrodes 306. As shown in FIGS. 3A-B, Pierce electrodes 306 may be positioned adjacent to exit electrodes 308. In some examples, electrode assembly 106 may be configured such that the region between exit electrodes 308 is substantially or entirely free of any electric field. More specifically, the region between Pierce electrodes 306 and opening 320 may be substantially or entirely free of any electric field along the direction parallel to first dimension 326. Due to the absence of any electric field, the ion beam may not be controlled or manipulated in this region. As a result, ion beams having low energy and high current may be more susceptible to space charge effects in this region. Pierce electrodes 306 may be configured to reduce space charge effects in this region. In particular, Pierce electrodes 306 may at least partially offset space charge effects by generating a suitable electric field along the boundary of the ion beam to prevent the ion beam from diverging. As shown in FIGS. 3A-B, Pierce electrodes 306 may define a portion of ion beam path 302 or 304 adjacent to exit electrodes 308 and may be positioned on opposite sides of vertical reference plane 340. Vertical reference plane 340 may be aligned with second dimension 328 of second opening 320. Second dimension 328 may be perpendicular to first dimension 326 of opening 320. Vertical reference plane 340 may be parallel to the plane of the drawing in FIG. 3A and thus may be perpendicular to horizontal reference plane 350.

To effectively control space charge effects in the region between exit electrodes 308, it may be desirable to position Pierce electrodes 306 in close proximity to exit electrodes 308. In some examples, Pierce electrodes 306 may be positioned adjacent to exit electrodes 308 such that no other electrode of electrode assembly 106 is positioned between Pierce electrodes 306 and exit electrodes 308. The ion beam may thus pass through Pierce electrodes 306 immediately prior to entering exit electrodes 308. In some examples, Pierce electrodes 306 may be positioned at the boundary between a region associated with exit electrodes 308 that is substantially free of electric fields and a region having electric fields generated by other electrodes (e.g., electrodes 314, 315, 322, 323, etc.) of electrode assembly 106. In other examples, Pierce electrodes 306 may be positioned as close as possible to exit electrodes 308 while still maintaining sufficient distance to prevent electrical arcing or shorting from occurring when a potential difference of approximately 20 kV is applied between exit electrodes 308 and Pierce electrodes 306. In a specific example, Pierce electrodes 306 may be positioned between approximately 2 millimeters and 5 millimeters from exit electrodes 308.

As described above, ion beam path 302 may be a curvilinear path. Specifically, ion beam path 302 may have an "S-shaped" trajectory. One or more electrodes that define ion beam path 302 may be configured to deflect an ion beam such that the ion beam follows the curvilinear "S-shaped" trajectory. In some examples, electrode assembly 106 may include a first set of electrodes configured to deflect the ion beam a first amount with respect to horizontal reference plane 350 as the ion beam travels along ion beam path 302 from opening 318 to Pierce electrodes 306. The first set of electrodes may be disposed between opening 318 and Pierce electrodes 306. In this example, the first set of electrodes may include at least two of electrodes 312, 322, 324, and 325. Thus, at least two of electrodes 312, 322, 324, and 325 may function to deflect the ion beam the first amount with respect to horizontal reference plane 350 such that the ion beam is directed from opening 318 up toward Pierce electrodes 306. It should be recognized that in other examples, the shape, size, and position of the first set of electrodes may vary.

In some examples, electrode assembly 106 may further include a second set of electrodes configured to deflect the ion beam a second amount with respect to horizontal reference plane 350 as the ion beam travels along ion beam path 302 from the first set of electrodes to opening 320. The second set of electrodes may be disposed between the first set of electrodes and opening 320. In particular, the second set of electrodes may define a portion of ion beam path 302 between the first set of electrodes and opening 320. In the present example, the second set of electrodes may include at least two of electrodes 314, 315, 322, and 323. Thus, at least two of electrodes 314, 315, 322, and 323 may function to deflect the ion beam the second amount with respect to horizontal reference plane 350 such that the ion beam is substantially parallel to horizontal reference plane 350 as it exits opening 320. It should be recognized that in other examples, the shape, size, and position of the second set of electrodes may vary. Additionally, it should be appreciated that the shape of exit electrodes 308 at ground potential may affect the electric field for deflecting the ion beam a second amount and thus in other examples, the shape, size, and position of exit electrodes 308 may vary.

The "S-shaped" trajectory of ion beam path 302 may be advantageous for reducing energy contamination in the ion beam. Specifically, neutral species in the ion beam may have a higher energy than the ions in the ion beam because the neutral species are not influenced by the electric field in electrode assembly 106 and thus are not decelerated by the electric field. Further, the neutral species in the ion beam may not be deflected by the electric field generated by the first set of electrodes and the second set of electrodes and thus may be filtered out from the ion beam along ion beam path 302. Accordingly, only ions in the ion beam may traverse electrode assembly 106 along ion beam path 302, thereby reducing energy contamination in the ion beam.

As described above, electrode assembly 106 may be positioned relative to magnetic analyzer 108 such that the ion beam is converging in the x-direction as it enters opening 316 or 318. The ion beam may converge to a focal point within electrode assembly 106. The focal point may be the only focal point of the ion beam between the exit of magnetic analyzer 108 and the middle (e.g., between electrodes 314 and 322 or between electrodes 322 and 325) of electrode assembly 106. Electrode assembly 106 may be positioned such that the focal point is at a suitable distance from opening 318 or 316. Positioning electrode assembly 106 such that the focal point is too close to opening 318 or 316 may cause the beam to diverge excessively through electrode assembly 106, which reduces the transmission of the ion beam through electrode assembly 106. Conversely, positioning electrode assembly 106 such that the focal point is too far from opening 318 or 316 may result in the short dimension of the ion beam being too large as it enters opening 318 or 316, which may cause the edges of the ion beam to be cut-off as it enters opening 318 or 316, or may increase the likelihood of the ion beam striking the surfaces of one or more electrodes (e.g., suppression electrodes 324). This may reduce the transmission of the ion beam through opening 318 or 316, or through the first set of electrodes (e.g. electrodes 312, 322, 324, and 325). In some examples, electrode assembly 106 may be suitably positioned such that the focal point is on ion beam path 302 or 304 inside electrode assembly 106 at a distance of approximately 10-50 mm, 20-40 mm, 10-30mm, or 15-25 mm from opening 318 or 316. The trajectory of the ion beam may be linear from opening 316 or 318 to the focal point. In some examples, the focal point may be positioned at a portion of ion beam path 302 or 304 that is defined by suppression electrodes 324. In some examples, the distance between opening 316 and the focal point of the ion beam entering opening 316 may be greater than the distance between opening 318 and the focal point of the ion beam entering opening 318. Further, in some examples, the focal point of the ion beam entering opening 318 may be positioned along a portion of ion beam path 302 that is disposed between terminal electrodes 310 and the first set of electrodes (e.g., electrodes 312, 322, 324, and 325).

In some examples, electrode assembly 106 may be configured to decelerate or accelerate a ribbon-shaped ion beam. A ribbon-shaped ion beam may refer to an ion beam having an elongated cross-section where a first dimension (e.g., long dimension) of the cross-section is greater than a second dimension (e.g., short dimension) of the cross-section. The first dimension of the cross-section may be perpendicular to the second dimension of the cross-section. In some examples, the first dimension of the cross-section may be at least approximately 300 mm. In these examples, the ion beam may be used to implant ions into a work piece (e.g., with a 300 mm diameter) using a one-dimensional scanning process, where the work piece is translated across the ion beam along a direction parallel to the second dimension of the cross-section. In other examples, the first dimension of the cross-section may be at least approximately 150 mm. In these examples, the ion beam may be used to implant ions into a work piece (e.g., with a 300 mm diameter) using a two-dimensional scanning process, where the work piece is translated multiple times across the ion beam along a direction parallel to the second dimension of the cross-section. Between each pass across the ion beam in the direction parallel to the second dimension, the work piece may be shifted a predetermined distance along a direction parallel to the first dimension of the cross-section. The predetermined distance may be significantly smaller than the first dimension of the cross-section of the ion beam (e.g. 20 mm).

In some examples, ion beam paths 302 and 304 may each be configured to allow the ribbon-shaped ion beam to pass through electrode assembly 106. Further, in some examples, first dimension 326 of opening 320 may be at least twice as large as second dimension 328 of opening 320. In some examples, first dimension 326 of opening 320 may be at least approximately 300 mm. Openings 316 and 318 may be similarly configured as opening 320 where each of openings 316 and 318 may have a first dimension that is at least twice as large as a second dimension.

In some examples, exit electrodes 308 and Pierce electrodes 306 may be configured such that a ribbon-shaped ion beam oriented with its first dimension approximately parallel to horizontal reference plane 350 may pass between exit electrodes 308 and Pierce electrodes 306. In particular, the distance between Pierce electrodes 306 may be greater than the distance between exit electrodes 308. In a specific example, the distance between Pierce electrodes 306 may be at least twice as large as the distance between exit electrodes 308. Further, in some examples, the distance between Pierce electrodes 306 may be greater than the diameter of the work piece to be implanted. In a specific example, the distance between Pierce electrodes 306 may be at least approximately 300 mm.

Figure 4:
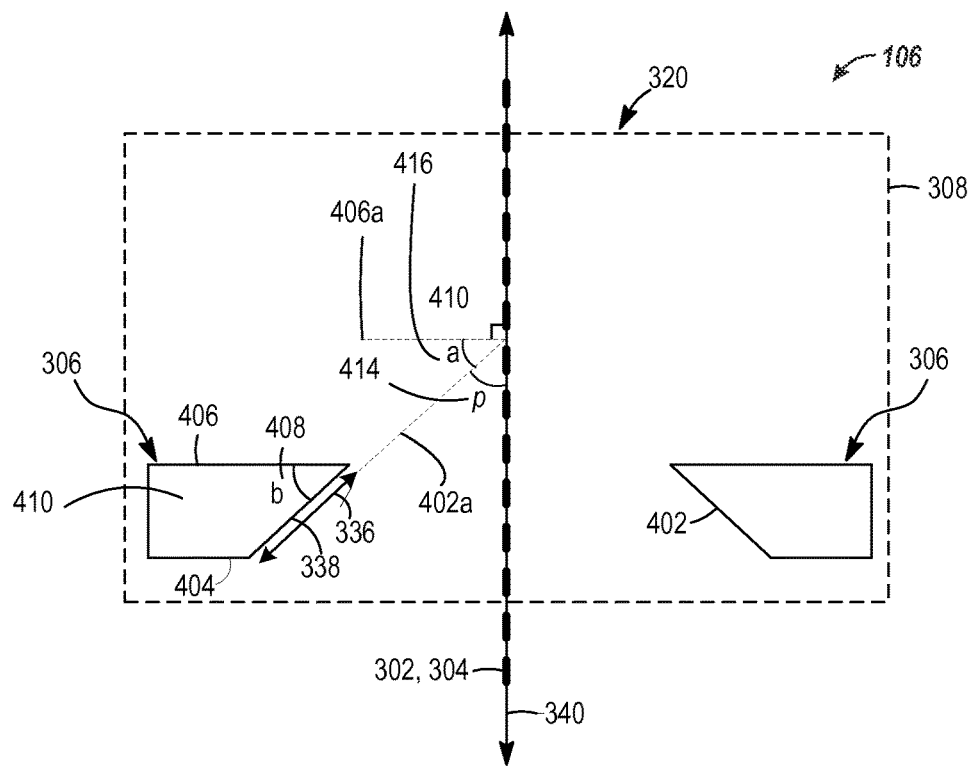
FIG. 4 illustrates an angled top-down perspective view of a portion of an electrode assembly, according to various examples.

With reference to FIG. 3B, each Pierce electrode 306 may include angled surface 338 facing ion beam paths 302 and 304. Angled surface 338 may have first dimension 336 that is perpendicular to second dimension 332. The position of angled surface 338 relative to ion beam paths 302 and 304 is more clearly depicted in FIG. 4. FIG. 4 illustrates an angled top-down perspective view of a portion of electrode assembly 106, according to various examples. The angled top-down perspective view may correspond to view angle 330 depicted in FIG. 3A. For simplicity, only a portion of electrode assembly 106 is depicted in FIG. 4. As shown, Pierce electrodes 306 may be disposed on opposite sides of ion beam paths 302 and 304 with angled surface 338 of each Pierce electrode facing ion beam paths 302 and 304. Angled surface 338 of each Pierce electrode 306 may be positioned such that ion beam paths 302 and 304 gradually narrow between Pierce electrodes 306 toward opening 320. Further, angled surface 338 of each Pierce electrode 306 may be positioned such that first dimension 336 of angled surface 338 forms angle p 414 with vertical reference plane 340. Angle p 414 may be referred to as the Pierce angle. In FIG. 4, vertical reference plane 340 may be perpendicular to the plane of the drawing. Pierce angle p 414 may be such that a suitable electric field can be generated by Pierce electrodes 306 along the boundary of the ion beam to resist divergence of the ion beam between exit electrodes 308. In some examples, Pierce angle p 414 may be between approximately 40 and 85 degrees. In some examples, Pierce angle p 414 may be between approximately 60 and 80 degrees. In some examples, Pierce angle p 414 may be between approximately 65 and 75 degrees. In some examples, Pierce angle p 414 may be between approximately 50 and 70 degrees. In some examples, Pierce angle p 414 may be between approximately 45 and 90 degrees. In some examples, Pierce angle p 414 may be between approximately 0 and 90 degrees. In a specific example, Pierce angle p 414 may be approximately 70 degrees.

Figure 5:
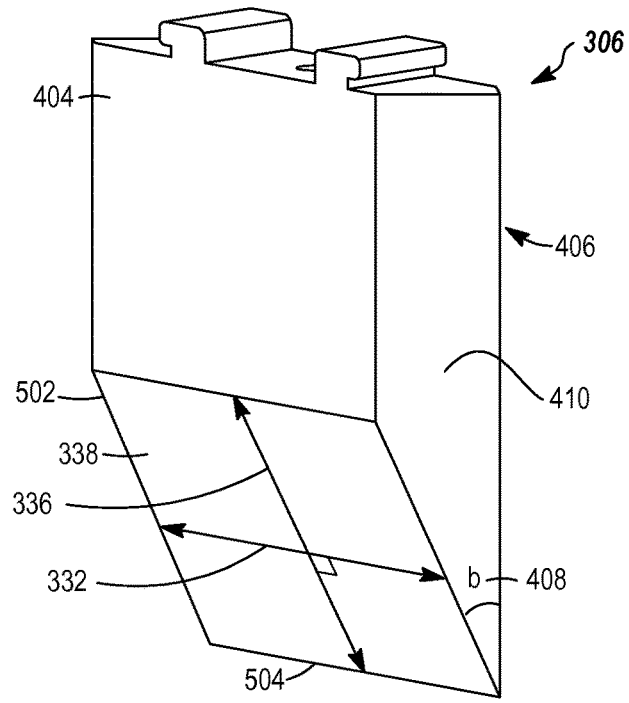
FIG. 5 illustrates a perspective view of a Pierce electrode, according to various examples.

FIG. 5 illustrates a perspective view of Pierce electrode 306, according to various examples. In this example, Pierce electrode 306 may have a trapezoidal configuration. Angled surface 338 may be a rectangular surface having first dimension 336 and second dimension 332. First dimension 336 may be parallel to edge 502 of Pierce electrode 306 and second dimension 332 may be parallel to edge 504 of Pierce electrode 306. First dimension 336 and second dimension 332 may be orthogonal to each other. Angled surface 338 may form angle b 408 with respect to surface 406. Surface 406 may be parallel to the long dimension of ion beam 105 or first dimension 326 of opening 320.

Although in the present example, Pierce electrodes 306 may have a trapezoidal configuration, it should be recognized that the shape of Pierce electrodes 306 may vary. For example, Pierce electrode 306 may comprise any configuration having angled surface 338 positioned such that first dimension 336 of angled surface 338 forms Pierce angle p 414 with respect to vertical reference plane 340. In some examples, the Pierce electrodes may have a triangular configuration. In other examples, electrodes may include a planar angled surface mounted on a supporting structure. The planar angled surface may be positioned similar to angled surface 338 described above. In addition, it should be recognized that the shape of angled surface 338 may vary. For example, angled surface 338 may be circular, square, or irregularly shaped. Further, in some examples, angled surface 338 may not be planar. For instance, in some examples, angled surface 338 may be concave or convex.

With reference back to FIG. 4, Pierce electrodes 306 may be positioned such that surface 406 of each Pierce electrode is orthogonal to vertical reference plane 340. As described above, first dimension 336 of angled surface 338 may form Pierce angle p 414 with vertical reference plane 340. More precisely, first dimension 336 may be extrapolated to intersect vertical reference plane 340 to form Pierce angle p 414. In some examples, the sum of Pierce angle p 414 and angle b 408 may be approximately 90 degrees. As shown in FIG. 4, reference line 406a is parallel to surface 406 and orthogonal to vertical reference plane 340. Accordingly, angle a 416 between reference line 406a and extrapolated first dimension 336 may be equal to angle b 408. The following equations may thus describe the relationship between angle a 416, Pierce angle p 414, and angle b 408:

$$a=b \qquad \text{(Eq. 1)}$$

$$a+p=90° \qquad \text{(Eq. 2)}$$

$$b=90°-p \qquad \text{(Eq. 3)}$$

Thus, based on the foregoing, angle b 408 may be a function of Pierce angle p 414. In some examples, angle b 408 may be between approximately 5 and 50 degrees. In some examples, angle b 408 may be between approximately 10 and 30 degrees. In some examples, angle b 408 may be between approximately 15 and 25 degrees. In some examples, angle b 408 may be between approximately 20 and 40 degrees. In some examples, angle b 408 may be between approximately 0 and 45 degrees. In some examples, angle b 408 may be between approximately 0 and 90 degrees. In a specific example, angle b 408 may be approximately 20 degrees.

With reference back to FIGS. 3A-B, Pierce electrodes 306 may be positioned such that second dimension 332 of angled surface 338 of each Pierce electrode 306 forms angle 334 (shown in FIG. 3A) with respect to horizontal reference plane 350. In some examples, angle 334 may be such that the portion of ion beam path 302 between Pierce electrodes 306 is approximately perpendicular to second dimension 332 of the angled surface. Thus, the ion beam may be perpendicular to second dimension 332 as the ion beam passes between Pierce electrodes 306 along ion beam path 302. In some examples, angle 334 may be between approximately 35 and 65 degrees. In other examples, angle 334 may be between approximately 45 degrees and 55 degrees. In yet other examples, angle 334 may be between approximately 50 degrees and 53 degrees.

Figure 6A:
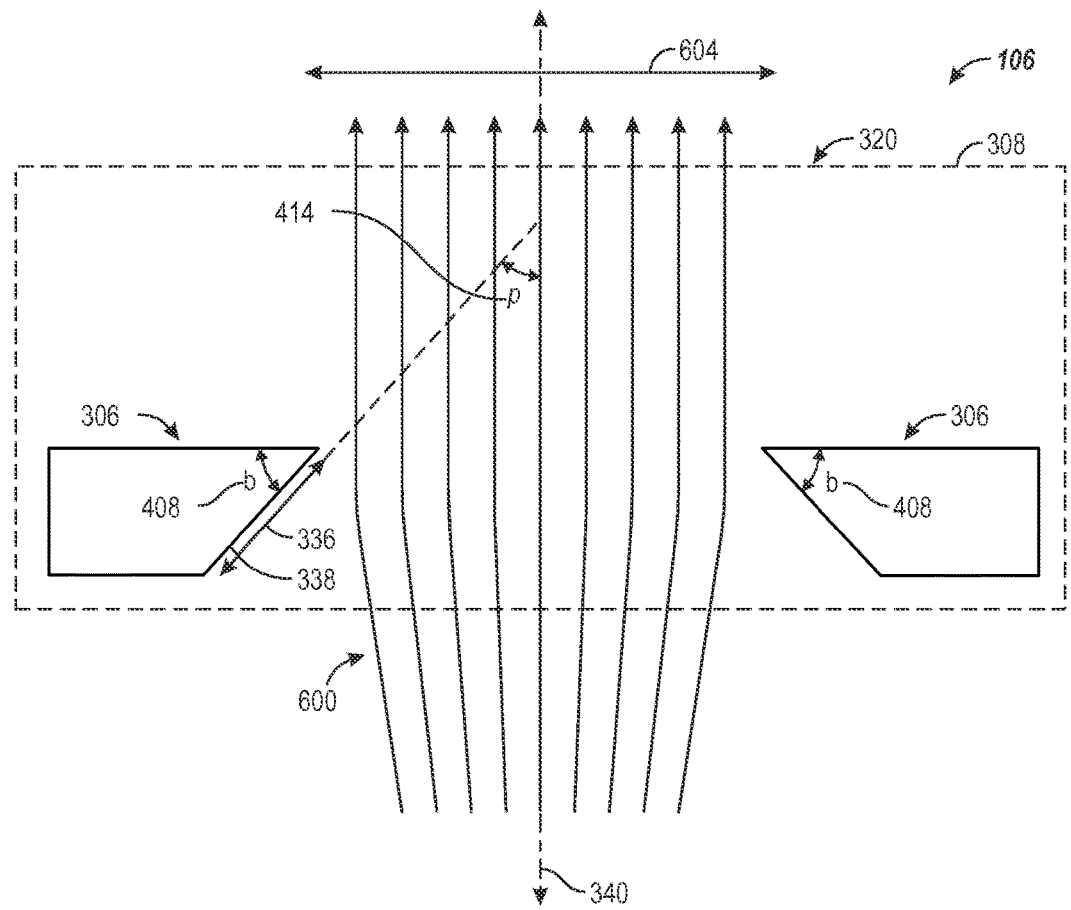
FIG. 6A illustrates an angled top-down perspective view of an ion beam passing through a portion of an electrode assembly with Pierce electrodes, according to various examples.
Figure 6B:
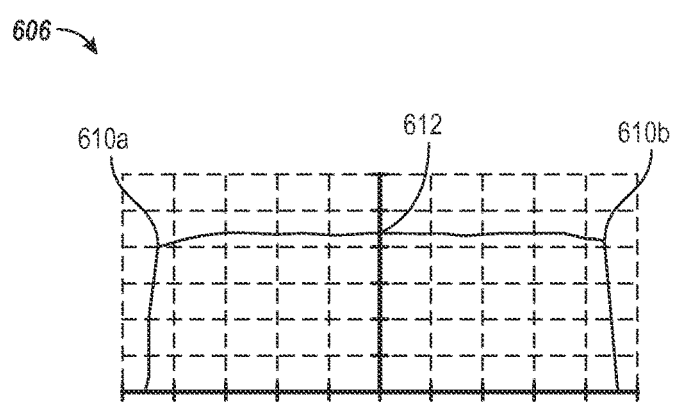
FIG. 6B illustrates an ion beam profile of an ion beam after exiting an electrode assembly with Pierce electrodes, according to various examples.

Turning now to FIG. 6A, an angled top-down perspective view of ion beam 600 passing through a portion of electrode assembly 106 is depicted. For simplicity, only a portion of electrode assembly 106 is depicted. The perspective view of FIG. 6A may correspond to view angle 330 depicted in FIG. 3A. As shown, ion beam 600 may remain substantially collimated as it passes between Pierce electrodes 306 and exit electrodes 308 and after it exits opening 320. Further, the beam density of ion beam 600 exiting through opening 320 may be substantially uniform across dimension 604 of ion beam 600. FIG. 6B illustrates ion beam profile 606 of ion beam 600 along dimension 604 after ion beam 600 exits opening 320. As shown in FIG. 6B, ion beam profile 606 may be substantially uniform where the beam density at left edge region 610a, center region 612, and right edge region 610b of ion beam profile 606 are substantially equal. In semiconductor fabrication, performing ion implantation using a collimated ion beam having a uniform beam density may be desirable for achieving superior dopant uniformities and robust process repeatability. Accordingly, ion beam 600 may be suitable for performing ion implantation in semiconductor fabrication.

In some examples, ion beam 600 described with respect to FIGS. 6A-B may be achieved by applying a suitable voltage to Pierce electrodes 306 and positioning angled surface 338 of each Pierce electrode 306 at suitable Pierce angle p 414. In particular, when a suitable voltage is applied and angled surface 338 of each Pierce electrode 306 is positioned at a suitable Pierce angle p 414, Pierce electrodes 306 may generate a suitable electric field along the boundary of ion beam 600 to achieve collimated ion beam 600 with uniform beam density depicted in FIG. 6A. The electric potential applied to Pierce electrodes 306 may be between approximately 0.5 and 10 kV, between approximately 1 and 8 kV, or between approximately 2 and 5 kV.

Figure 7A:
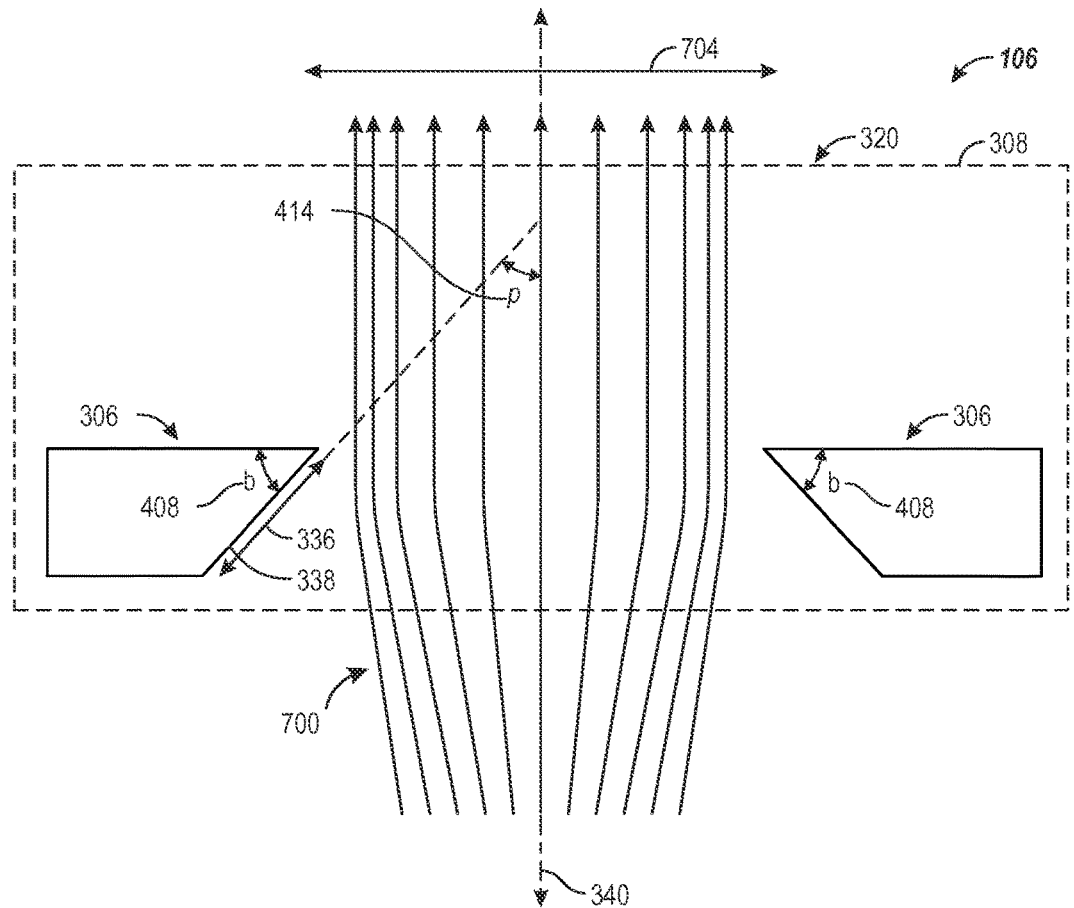
FIG. 7A illustrates an angled top-down perspective view of an ion beam passing through a portion of an electrode assembly with Pierce electrodes, according to various examples.
Figure 7B:
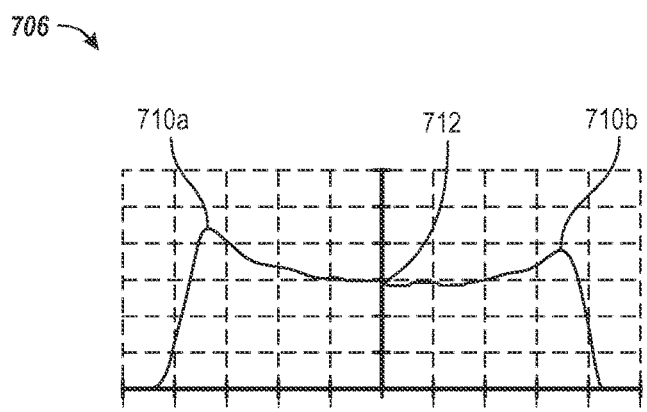
FIG. 7B illustrates an ion beam profile of an ion beam after exiting an electrode assembly with Pierce electrodes, according to various examples.

Turning now to FIG. 7A, an angled top-down perspective view of ion beam 700 passing through a portion of electrode assembly 106 is depicted. As in FIG. 6A, the perspective view of FIG. 7A may correspond to view angle 330 depicted in FIG. 3A. As shown, ion beam 700 may remain substantially collimated as it passes through Pierce electrodes 306 and exit electrodes 308 and after it exits opening 320. However, in this example, the beam density of ion beam 700 exiting opening 320 may be non-uniform along dimension 704 of ion beam 700. FIG. 7B illustrates ion beam profile 706 of ion beam 700 along dimension 704 after ion beam 700 exits opening 320. As shown in FIG. 7B, ion beam profile 706 may exhibit a non-uniform "horned" profile where the beam density at left edge region 710a and right edge region 710b of ion beam 700 are significantly greater than the beam density at center region 712 of ion beam 700. The poor beam density uniformity of ion beam 700 may be caused by at least one of an unsuitable voltage applied to Pierce electrodes 306 and an unsuitable Pierce angle p 414 at which angled surface 338 of each Pierce electrode 306 is positioned. Performing ion implantation using ion beam 700 may result in poor dopant uniformities and poor process control. Accordingly, ion beam 700 may not be suitable for performing ion implantation in semiconductor fabrication.

Figure 8:
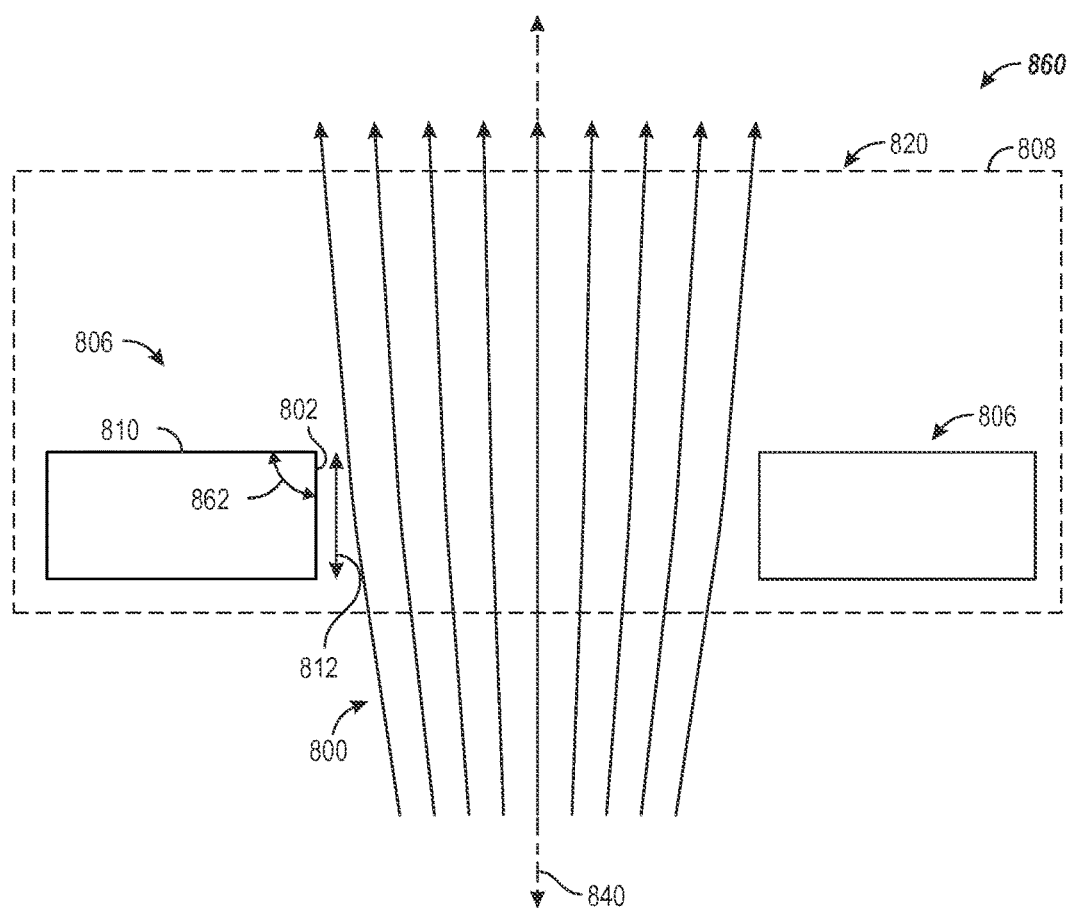
FIG. 8 illustrates an angled top-down perspective view of an ion beam passing through a portion of an exemplary electrode assembly without Pierce electrodes.

Turning now to FIG. 8, an angled top-down perspective view of ion beam 800 passing between electrodes 806 of electrode assembly 860 is depicted. For simplicity, only a portion of electrode assembly 860 that includes electrodes 806, exit electrodes 808, and opening 820 is depicted in FIG. 8. Electrode assembly 860 may be similar to electrode assembly 106 except that electrode assembly 860 does not include Pierce electrodes 306. Instead, electrodes 806 take the place of Pierce electrodes 306. Vertical reference plane 840 may be similar or identical to vertical reference plane 340 described in FIGS. 3A, 4, 6A, and 7A. Electrodes 806 may be similarly positioned as Pierce electrodes 306. However, as shown in FIG. 8, surface 802 of each electrode 806 may be positioned differently from surface 338 of each Pierce electrode 306. Specifically, dimension 812 of surface 802 may be approximately parallel to vertical reference plane 840. In other words, dimension 812 may form an angle of approximately 0 degrees with respect to vertical reference plane 840. Further, angle 862 of surface 802 with respect to surface 810 may be approximately 90 degrees.

In some examples, electrodes 806 may not be capable of generating a suitable electric field along the boundary of ion beam 800 to sufficiently resist divergence of ion beam 800 between exit electrodes 808. For example, as shown in FIG. 8, the electric field generated by electrodes 806 may cause ion beam 800 to become slightly less divergent. However, the electric field generated by electrodes 806 may not be capable of causing ion beam 800 to become collimated. In particular, as shown in FIG. 8, ion beam 800 may continue to diverge between exit electrodes 808 after passing between electrodes 806. Ion beam 800 may also diverge significantly as it exits opening 820. As a result, although ion beam 800 may be suitable for performing ion implantation for certain semiconductor fabrication processes, it may not be suitable for use in the fabrication of advanced next generation semiconductor devices. Further, in order to generate an electric field capable of partially resisting the divergence of ion beam 800 between exit electrodes 808, a significantly high potential (e.g., 3-8 kV) may need to be applied to electrodes 806. The distances between electrodes 806 and other nearby electrodes (e.g., electrodes 314, 315, 308, 322, or 325) may thus be greater than with Pierce electrodes 306 to prevent electrical discharge (e.g., arcing) due to the higher applied potential.

It should be appreciated that electrode assembly 106 may include other components and that some components described above may be optional. For instance, in some examples, electrode assembly 106 may include additional or fewer electrodes. In other examples, electrode assembly may include only one of ion beam path 302 or 304. Further, it should be recognized that the electrodes of electrode assembly 106, including Pierce electrodes 306, may be coupled to one or more voltage sources. Thus, the electrodes of electrode assembly 106 may generate, using the one or more voltage sources, suitable electric fields to manipulate the ion beam along ion beam path 302 or 304. In particular, the voltage source may be used to apply a voltage to Pierce electrodes 306 to generate a suitable electric field along the boundary of the ion beam that resists divergence of the ion beam between exit electrodes 308.

With reference back to FIGS. 1A-B, ion beam 105 exiting from electrode assembly 106 may be directed through multipole magnets 114. Multipole magnets 114 may be similar to multipole magnets 110 described above. In some examples, multipole magnets 114 may include fewer or additional coils compared to multipole magnets 110. In some examples, multipole magnets 114 may be configured to adjust the shape, direction, focus, and/or uniformity of ion beam 105. In addition, multipole magnets 114 may be configured to steer ion beam 105 to strike the surface of work piece 116 in a particular location or to allow for other positional adjustments of ion beam 105. In other examples, multipole magnets 114 may be configured to repeatedly deflect ion beam 105 to scan work piece 116, which may be stationary or moving.

Positioning multipole magnets 114 downstream of electrode assembly 106 may be advantageous to enable more effective tuning of ion beam 105 immediately prior to implanting work piece 116. In particular, the shape, direction, focus, and uniformity of ion beam 105 exiting electrode assembly 106 may be more precisely adjusted independent of electrode assembly 106. For example, ion beam 105 may be adjusted using multipole magnets 114 to better achieve a parallel beam (e.g., divergence/convergence angle is approximately zero in the y-direction and/or x-direction) with a uniform current density for implanting work piece 116. A parallel beam with uniformity current density may be desirable for achieving uniform dopant concentration and profile across work piece 116. In another example, ion beam 105 may be adjusted using multipole magnets 114 to achieve a divergent beam (e.g., divergence angle is between approximately 2-20 degrees in the x-direction and/or y-direction) for implanting work piece 116. A divergent beam may be desirable for achieving a more conformal implantation of non-planar semiconductor structures (e.g., finFETs).

Work piece support structure 118 may be configured to position work piece 116 in front of ion beam 105 exiting multiple magnets 114 to cause ions to implant into work piece 116. In some examples, work piece support structure 118 may be configured to translate in one or more directions. For example, work piece support structure 118 may be configured to move work piece 116 with respect to ion beam 105 to scan ion beam 105 across work piece 116. More specifically, work piece support structure 118 may be configured to move work piece 116 in a direction (e.g., depicted by arrows 132) parallel to the x-dimension of ion beam 105. Further, work piece support structure 118 may be configured to rotate work piece 116. Work piece support structure 118 may be similar or identical to work piece support structure 900 described below with reference to FIG. 9.

Figure 9:
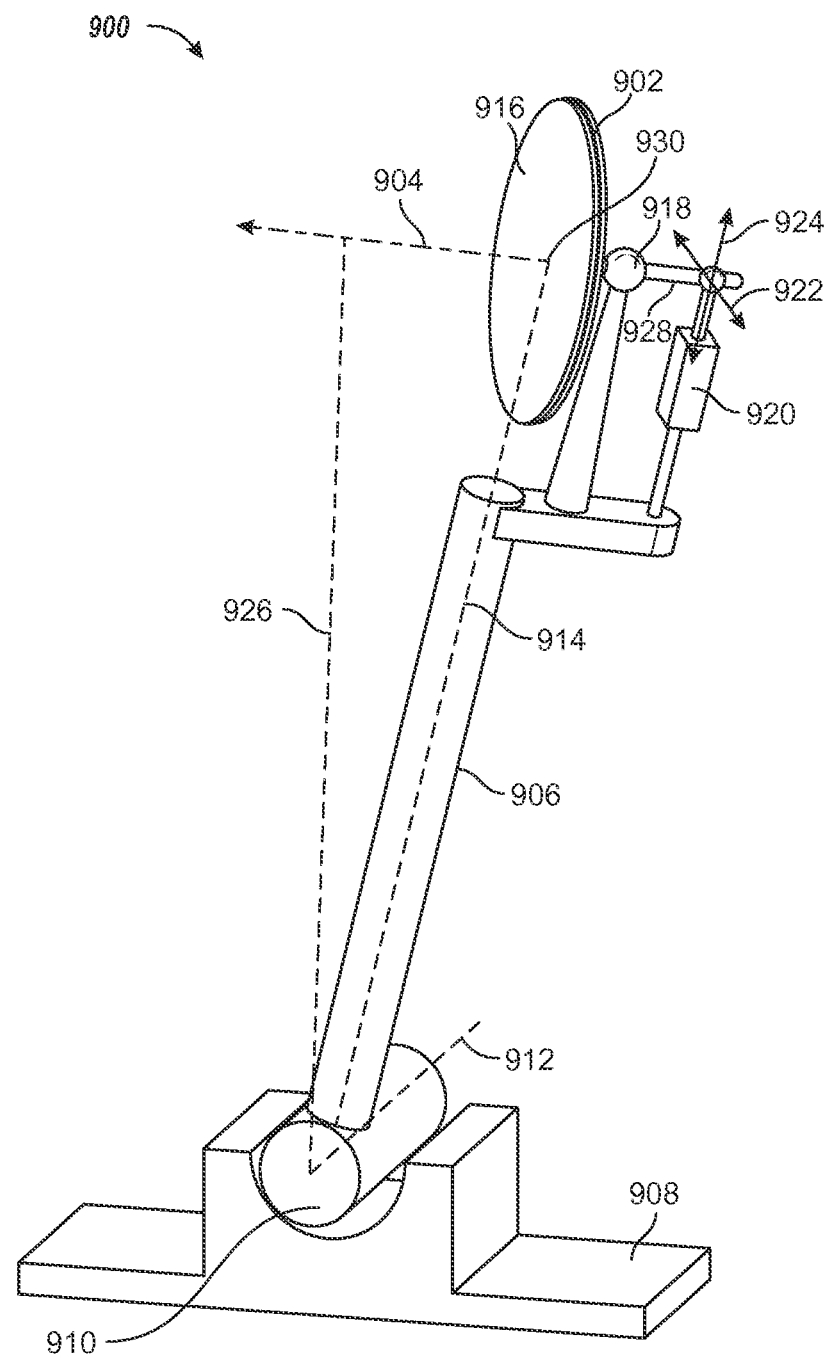
FIG. 9 illustrates a work piece support structure of an ion implantation system, according to various examples.

FIG. 9 illustrates work piece support structure 900, according to various examples. Work piece support structure 900 may include work piece holder 902 configured to hold work piece 916. Work piece 916 may be a substrate, such as, a semiconductor wafer. In this example, work piece holder 902 may be an electrostatic chuck that is configured to electrostatically clamp onto work piece 916. It should be appreciated that in other examples, work piece holder 902 may implement other clamping mechanisms (e.g., vacuum, mechanical, etc.) to hold work piece 916. Work piece holder 902 may be configured to rotate work piece 916 with respect to twist axis 904. For example, work piece holder 902 may be coupled to a twist drive mechanism and a twist motor to rotate work piece holder 902 (and thus work piece 916) with respect to twist axis 904. Work piece holder 902 may be further configured to tilt work piece 916 about spherical pivot 918. As shown in FIG. 9, work piece holder 902 may be coupled to one or more actuators 920 configured to move in the directions indicated by arrows 922, 924. One or more actuators 920 may move shaft 928, which may cause work piece holder 902 (and thus work piece 916) to tilt about spherical pivot 918. In particular, one or more actuators 920 are disposed at the end of scan arm 906 and may tilt work piece holder 902 without altering the position of scan arm 906 or base 908.

Work piece holder 902 may be coupled to base 908 via scan arm 906. Scan arm 906 and base 908 may be configured to translate work piece holder 902 (and thus work piece 916) along an arcuate path by rotating work piece holder 902 with respect to scan axis 912. Reference axis 926 is parallel to the y-direction of the ion beam. As scan arm 906 and work piece holder 902 is rotated with respect to scan axis 912, the central axis of scan arm 906 may be positioned at a scan angle with respect to reference axis 926. Base 908 may be configured to rotate scan arm 906 and work piece holder 902 with respect to tilt axis 914, thereby causing work piece 916 to tilt with respect to tilt axis 914. In particular, base 908 may include driving apparatus 910 configured to rotate scan arm 906 and work piece holder 902 with respect to scan axis 912 and with respect to tilt axis 914. Tilt axis 914 may be aligned with respect to the central axis of scan arm 908. Further, tilt axis 914 may be aligned with center 930 of work piece 916 held on work piece holder 902. Aligning tilt axis 914 with center 930 of work piece 916 may be desirable to enable the tilt angle of work piece 916 with respect to tilt axis 914 to be more easily controlled. For example, center 930 of work piece 916 may remain unchanged at any tilt angle of work piece 916 with respect to tilt axis 914. In particular, the tilt angle of work piece 916 with respect to tilt axis 914 may be unambiguously derived from the angle at which scan arm 906 is rotated with respect to tilt axis 914.

Figure 10:
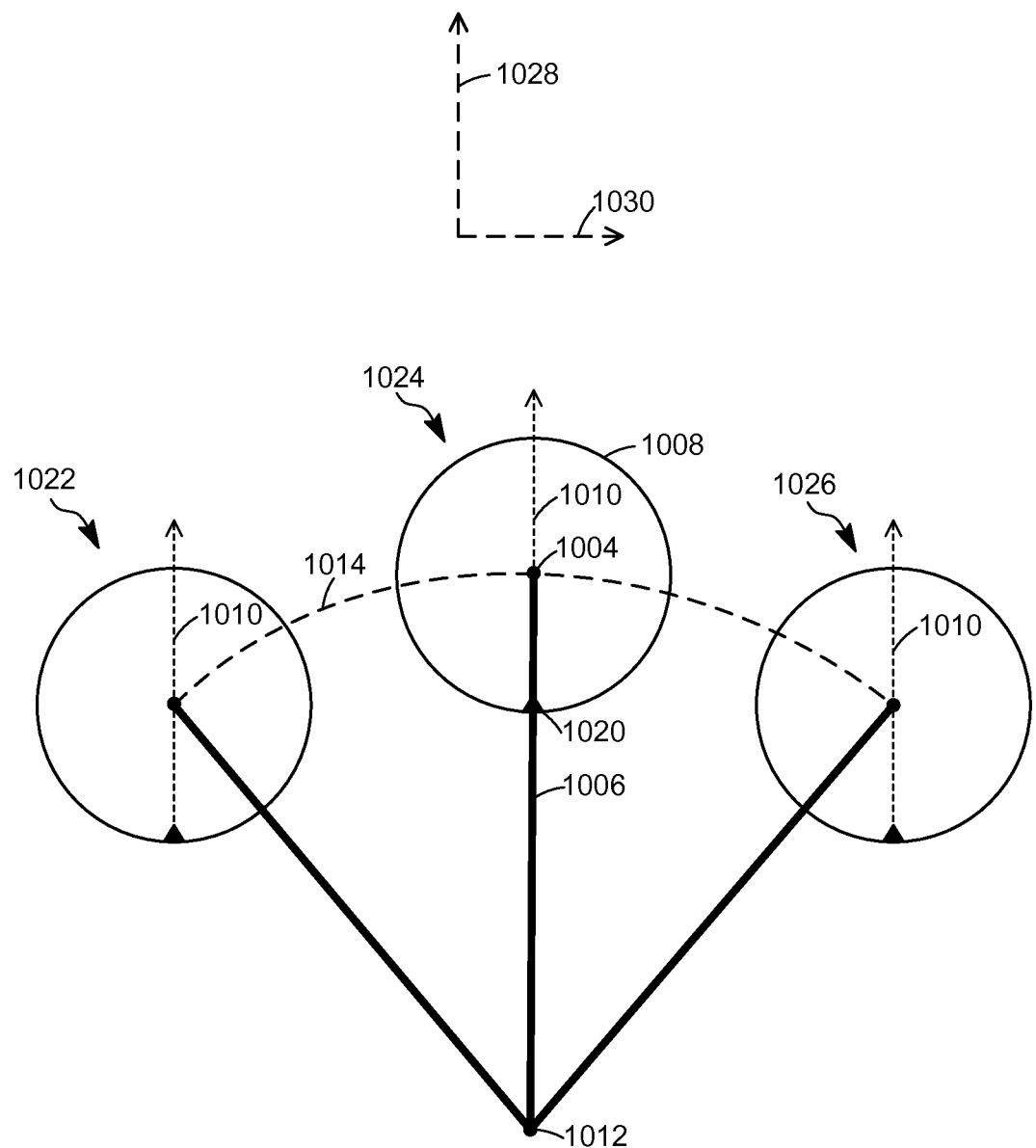
FIG. 10 illustrates linear scanning of a work piece implemented using a work piece support structure, according to various examples.

Work piece support structure 900 may be operable to linearly scan the work piece across the ion beam. In particular, work piece support structure 900 may linearly scan the work piece in the x-direction of the ion beam such that the vertical axis of the work piece remains parallel to the y-direction of the ion beam during the scan. For example, FIG. 10 illustrates linear scanning of work piece 1008 implemented using work piece support structure 900, according to various examples. As shown, FIG. 10 depicts work piece 1008 at positions 1022, 1024, and 1026 as it is scanned along arcuate path 1014 by rotating scan arm 1006 with respect to scan axis 1012. In FIG. 10, scan axis 1012 is perpendicular to the plane of the drawing. The ion beam may be directed at work piece 1008 in a direction perpendicular to the plane of the drawing. As work piece 1008 is scanned along arcuate path 1014, work piece 1008 may be rotated with respect to twist axis 1004 such that vertical axis 1010 of work piece 1008 remains parallel to y-direction 1028 of the ion beam. In this way, work piece 1008 may be effectively scanned linearly in a direction parallel to x-direction 1030 of the ion beam and perpendicular to vertical axis 1010 of work piece 1008. In this example, vertical axis 1010 of work piece 1008 is aligned with the center of work piece 1008 and reference notch 1020 of work piece 1008. During linear scanning of the work piece, the linear velocity of the ion beam with respect to the work piece may be uniform across the entire work piece, which improves dopant uniformity across the work piece.

In some examples, with reference to FIG. 9, work piece 916 may be tilted by rotating scan arm 906 (and in turn rotating work piece holder 902) with respect to tilt axis 914. Tilting work piece 916 in this manner may allow the ion beam to impinge on work piece 916 at an angle of incidence that is not perpendicular to the surface of the work piece. In some examples, performing linear scanning of work piece 916, as described above, while tilting work piece 916 may result in the angle of incidence of the ion beam varying across work piece 916 during the linear scanning. In these examples, one or more actuators 920 of work piece support structure 900 may be used to adjust the tilt of work piece 916 such that the angle of incidence of the ion beam is uniform and constant across work piece 916 during the linear scanning.

In some examples, work piece support structure 900 may be further configured to control the temperature of work piece 916. For example, work piece holder 902 may be configured to flow heated or cooled gas onto the backside of work piece 116 to control the temperature of work piece 916. In other examples, work piece holder 902 may be configured to be heated or cooled using fluid from a fluid heat exchanger. Work piece holder 902 may be configured to establish good thermal contact with work piece 916 and thus the temperature of work piece 916 may be controlled by controlling the temperature of work piece holder 902. In yet other examples, work piece holder 902 may include heating and cooling elements (e.g., thermoelectric elements, resistive heating elements, etc.) to control the temperature of work piece 916.

Additional exemplary aspects of work piece support structure 900 and the method of using work piece support structure 900 to linearly scan the work piece in the x-direction of the ion beam such that the vertical axis of the work piece remains parallel to the y-direction of the ion beam during the scan are described in U.S. Pat. No. 8,895,944 and U.S. Publication No. 2014/0367587, which are incorporated herein by reference in their entirety.

With reference back to FIGS. 1A-B, system 100 may further include one or more heating and/or cooling modules (not shown) that are configured to heat or cool work piece 116 prior to placing work piece 116 onto work piece support structure 118 and after ion implantation is completed. For example, in a high-temperature ion implantation process, work piece 116 may be transferred from a load lock cassette (not shown) of system 100 to a heating module to pre-heat work piece 116 to a desired process temperature. Work piece 116 may then be transferred from the heating module to work piece support structure 118 to perform the ion implantation. The heating module may be desirable to reduce the time required for work piece support structure 118 to bring work piece 116 to the desired processing temperature prior to initiating ion implantation, which increases the throughput of system 100. Upon completion of the ion implantation, work piece 116 may be transferred from work piece support structure 118 to a cooling module to cool work piece 116 back down to ambient temperature. Work piece 116 may then be returned to the load lock cassette. Additional exemplary aspects of the heating and cooling modules are described in U.S. application Ser. No. 14/595,813, filed on Jan. 13, 2015, entitled "Method and Ion Implanter for Low Temperature Implantation," and U.S. application Ser. No. 14/607,867, filed on Jan. 28, 2015, entitled "Ion Implanter and Method for Ion Implantation," which are incorporated herein by reference in their entirety.

System 100 may further include at least two load locks (not shown). Each load lock may be configured to receive wafers from a Front Opening Universal Pod (FOUP). In particular, each load lock may be configured such that at least 25 work pieces may be transferred from a FOUP to a cassette of the load lock. Thus, all the work pieces from a first standard FOUP may be transferred into the first load lock prior to pumping down the load lock to the required pressure. All the work pieces from a second standard FOUP may then be transferred into the second load lock and pumped down to the required pressure in parallel while waiting for the work pieces of the first load lock wafers to be implanted. Such a configuration may be desirable for achieving a high-throughput (e.g., greater than 400 work pieces per hour) of system 100.

It should be recognized that work piece 116 may comprise any suitable substrate used in the manufacturing of semiconductor devices, solar panels, or flat-panel displays. In examples where work piece 116 comprises a semiconductor substrate (e.g., silicon, germanium, gallium arsenide, etc.), work piece 116 may include semiconductor devices at least partially formed thereon.

Further, it should be appreciated that suitable variations and modifications may be made to system 100. For instance, system 100 may include additional components such as additional electrodes and magnets for manipulating ion beam 105. Further, in some examples, system 100 may include more than one variable aperture assembly for controlling the current of ion beam 105.

Figure 11:
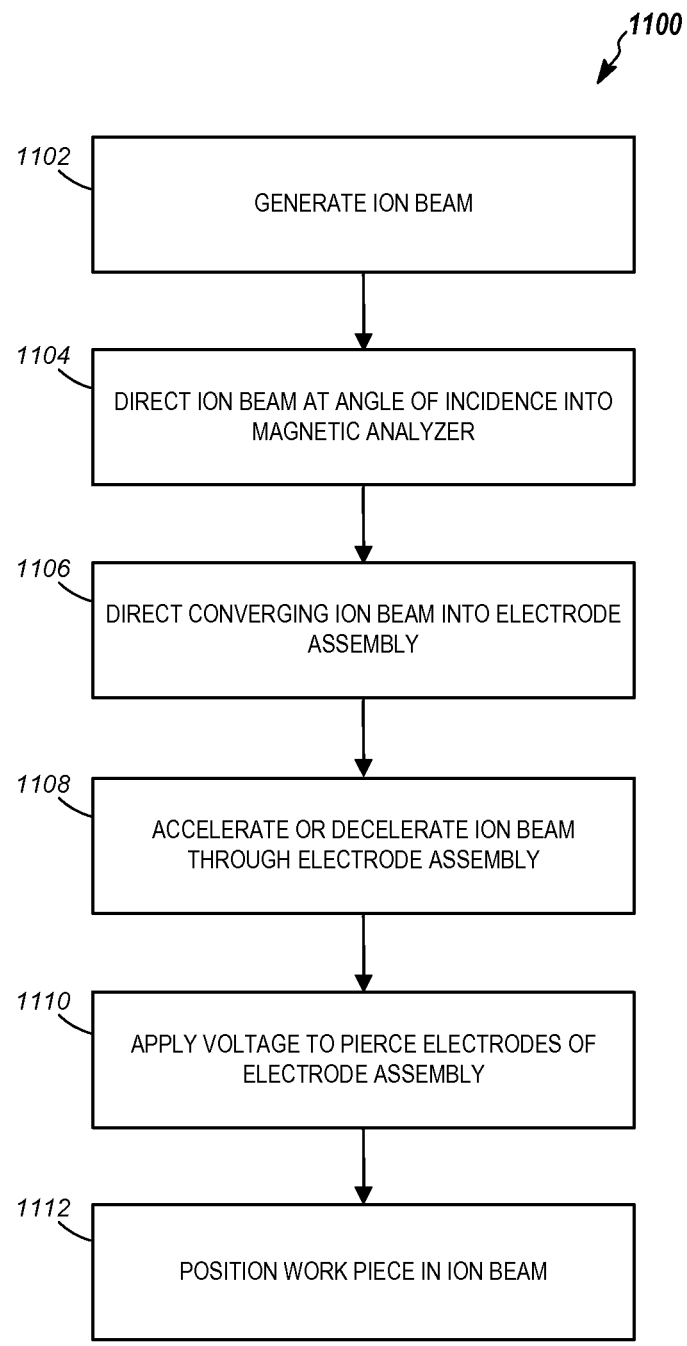
FIG. 11 illustrates an ion implantation process using the ion implantation system of FIGS. 1A-B, according to various examples.

FIG. 11 illustrates process 1100 for implanting ions into a work piece, according to various examples. Process 1100 may be performed using ion beam implantation system 100, described above with reference to FIGS. 1A-B. Process 1100 is described below with simultaneous reference to FIGS. 1A-B and FIG. 11.

At block 1102 of process 1100, ion beam 105 may be generated. In some examples, ion beam 105 may be generated using ion source 102 and extraction manipulator 104. Generating ion beam 105 using ion source 102 and extraction manipulator 104 may include forming a plasma from one or more process gases in arc chamber 124 to generate the desired ion species. Suitable voltages may be applied to faceplate 136, suppression electrode 120, and ground electrode 122 to extract ion beam 105 from ion source 102 at the desired energy level. For example, to generate ion beam 105 comprising positive ions, a positive potential relative to ground may be applied to faceplate 136. In addition, a negative potential relative to ground may be applied to suppression electrode 120 to repel electrons downstream of extraction manipulator 104 from flowing into ion source 102.

In some examples, ion beam 105 may be generated having an elongated ribbon-shaped cross-section. For example, as described above, the cross-section of ion beam 105 may have a long dimension that is perpendicular to a short dimension of ion beam 105. In some examples, the ratio of the long dimension to the short dimension of the cross-section of ion beam 105 at work piece 116 may be at least 3:1. In some examples, the long dimension of ion beam 105 at work piece 116 may be at least 300 mm.

In some examples, ion beam 105 may be generated such that it diverges in the x-direction and/or the y-direction as it travels toward and enters into magnetic analyzer 108. In particular, ion beam 105 may have a divergence angle in the y-direction that is greater than approximately 2.5 degrees. For example, the divergence angle may be approximately 3.0-4.0 degrees or approximately 3.3-3.7 degrees.

At block 1104, ion beam 105 may be directed into magnetic analyzer 108 at angle of incidence 140. In some examples, angle of incidence 140 may be greater than approximately 2 degrees. In other examples, angle of incidence 140 may be approximately 2-8 degrees or approximately 4-6 degrees. In some examples, magnetic analyzer 108 may be configured to deflect ion beam 105 in the x-direction and ion beam 105 may be angled toward the x-direction with respect to central axis 138 as ion beam 105 enters magnetic analyzer 108. Ion beam 105 may be diverging in the x-direction as it enters magnetic analyzer 108 and may be focused by magnetic analyzer such that it converges in the x-direction as it exits magnetic analyzer 108. Further, ion beam 105 may diverge in the y-direction as it enters magnetic analyzer 108 and continue to diverge in the y-direction as it travels through and exits magnetic analyzer 108. In some examples, at least approximately 90% (or at least approximately 95%) of ion beam 105 may be transmitted through opening 111 of magnetic analyzer.

At block 1106 of process 1100, ion beam 105 may be directed into electrode assembly 106. In particular, magnetic analyzer 108 may direct ion beam 105 along a linear path from opening 113 of magnetic analyzer 108 to one of openings 316 or 318 of electrode assembly 106. Ion beam 105 may continuously converge in the x-direction as it travels from magnetic analyzer 108 to electrode assembly 106. Further, ion beam 105 may converge in the x-direction as ion beam 105 enters through opening 316 or 318 of electrode assembly 106. Ion beam 105 may converge to a focal point within electrode assembly 106. The focal point may be the only focal point of ion beam 105 between the exit of magnetic analyzer 108 and the middle (e.g., between electrodes 314 and 322 or between electrode 322 and 325 in FIG. 3A) of electrode assembly 106. The focal point may be positioned at a suitable distance from opening 318 or 316. In some examples, the focal point may be in ion beam path 302 or 304 at a distance of approximately 10-50 mm, 20-40 mm, 10-30mm, or 15-25 mm from opening 318 or 316. The trajectory of ion beam 105 may be linear from opening 316 or 318 to the focal point. In some examples, the focal point may be positioned at a portion of ion beam path 302 or 304 that is defined by suppression electrodes 324. In some examples, the distance between opening 316 and the focal point of the ion beam entering opening 316 may be greater than the distance between opening 318 and the focal point of the ion beam entering opening 318. Further, in some examples, the focal point of the ion beam entering opening 318 may be positioned along a portion of ion beam path 302 that is disposed between terminal electrodes 310 and the first set of electrodes (e.g., electrodes 312, 322, 324, and 325).

At block 1108 of process 1100, ion beam 105 may be accelerated or decelerated through electrode assembly 106. In some examples, ion beam 105 may be accelerated through electrode assembly 106 along ion beam path 304. In these examples, ion beam 105 may enter electrode assembly 106 through opening 316 at an initial energy, accelerate along ion beam path 304, and exit electrode assembly 106 through opening 320 at a final energy that is greater than the initial energy. In other examples, ion beam 105 may be decelerated through electrode assembly 106 along ion beam path 302. In these examples, ion beam 105 may enter electrode assembly 106 through opening 318 at an initial energy, decelerate along ion beam path 302, and exit electrode assembly 106 through opening 320 at a final energy that is lower than the initial energy.

In examples where ion beam 105 contains positive ions, ion beam 105 may be accelerated through electrode assembly 106 by applying a negative potential difference across electrode assembly 106. In one example, a negative potential difference may be applied by coupling exit electrodes 308 to ground potential and applying a positive voltage relative to ground potential to terminal electrodes 310. Conversely, in examples where ion beam 105 contains positive ions, ion beam 105 may be decelerated through electrode assembly 106 by applying a positive potential difference across electrode assembly 106. In one example, a positive potential difference may be applied by coupling exit electrodes 308 to ground potential and applying a negative voltage relative to ground potential to terminal electrodes 310.

In examples where ion beam 105 is decelerated through electrode assembly 106, process 1100 may include deflecting ion beam 105 such that ion beam 105 follows the curvilinear ion beam path 302 through electrode assembly 106. In some examples, with reference to FIG. 3A, ion beam 105 may be deflected a first amount with respect to horizontal reference plane 350 as ion beam 105 travels along ion beam path 302 from opening 318 to Pierce electrodes 306. Ion beam 105 may be deflected the first amount using the first set of electrodes of electrode assembly 106 described above. In some examples, the first set of electrodes may include at least two of electrodes 312, 322, 324, and 325 of electrode assembly 106. Further, in some examples, ion beam 105 may be deflected a second amount with respect to horizontal reference plane 350 as ion beam 105 travels along ion beam path 302 from the first set of electrodes of electrode assembly 106 to opening 320. Ion beam 105 may be deflected the second amount using the second set of electrodes of electrode assembly 106 described above. In some examples, the second set of electrodes may include at least two of electrodes 314, 315, 322, and 323 of electrode assembly 106.

At block 1110 of process 1100, a voltage may be applied to Pierce electrodes 306. Ion beam 105 may pass between Pierce electrodes 106 as ion beam 105 passes through electrode assembly 106 along ion beam paths 302 or 304. In some examples, with reference to FIG. 3A, ion beam 105 may be approximately perpendicular to second dimension 332 of angled surface 338 of each Pierce electrode 306 as ion beam 105 passes between Pierce electrodes 306 along ion beam path 302. As described above, Pierce electrodes 306 may function to control space charge effects and thus resist space charge blow-up of ion beam 105. Applying the voltage to Pierce electrodes 306 may be particularly desirable when ion beam 105 is decelerated along ion beam path 302 and enters exit electrodes 308 having high current and low energy. In some examples, the voltage applied to Pierce electrodes 306 may cause Pierce electrodes 306 to generate an electric field along the boundary of ion beam 105 to resist divergence of ion beam 105 between exit electrodes 308. As a result, ion beam 105 may gradually become less divergent as it passes between Pierce electrodes 306 toward opening 320. This enables ion beam 105 to remain collimated as it passes between exit electrodes 308 and exits electrode assembly 106. In some examples, the voltage applied to the Pierce electrodes 306 may be between approximately 0 kV and 10 kV. In other examples, the voltage applied to the Pierce electrodes 306 may be between approximately 1 kV and 9 kV. In yet other examples, the voltage applied to the Pierce electrodes 306 may be between approximately 2 kV and 5 kV.

At block 1112 of process 1100, work piece 316 may be positioned in ion beam 105 to implant ions into work piece 116. For example, work piece 116 may be positioned using work piece support structure 118 such that ion beam 105 impinges onto work piece 116, thereby causing ions to implant into work piece 116. In some examples, work piece support structure 118 may move work piece 116 relative to ion beam 105 to cause ion beam 105 to scan across work piece 116. In particular, as described above with reference to FIGS. 9 and 10, work piece support structure 118 may linearly scan work piece 116 in the x-direction relative to ion beam 105. Specifically, work piece support structure 118 may move work piece 116 in a direction (e.g., depicted by arrows 132) parallel to the x-dimension of ion beam 105. The scan speed of work piece 116 may be controlled using work piece support structure 118 to fine-tune the dose rate of ions implanted. Further, work piece support structure 118 may rotate work piece 116 to enable ions to implant uniformly into work piece 116.

Work piece 116 may comprise any suitable substrate used in the manufacturing of semiconductor devices, solar panels, or flat-panel displays. In examples where work piece 116 comprises a semiconductor substrate (e.g., silicon, germanium, gallium arsenide, etc.), work piece 116 may include semiconductor devices at least partially formed thereon. Further, work piece 116 may include a top-most mask layer. The mask layer may comprise a photo-resist layer or a hard mask layer (e.g., silicon nitride, silicon oxide, silicon oxynitride, silicon carbide, carbon, etc.)

It should be appreciated that some blocks in process 1100 may be combined, the order of some blocks can be changed, and some blocks can be omitted. Further, it should be appreciated that additional blocks may be performed. For example, process 1100 may include generating a magnetic field using multipole magnetics 110 and/or 114 to cause ion beam 105 to converge or diverge in the x-direction and/or y-direction as ion beam 105 impinges onto work piece 116. A converging or diverging ion beam 105 may be advantageous for achieving conformal ion implantation of non-planar devices (e.g., finFETs). Additional aspects of generating a converging or diverging ion beam 105 to perform ion implantation are described in Taiwan Patent Application No. 103138995, filed on Nov. 11, 2014, entitled "Method for Ion Implantation," and Taiwan Patent Application No. 103122293, filed on Jun. 27, 2014, entitled "Ion Implanter," which are incorporated herein by reference in their entirety.

While specific components, configurations, features, and functions are provided above, it will be appreciated by one of ordinary skill in the art that other variations may be used. Additionally, although a feature may appear to be described in connection with a particular example, one skilled in the art would recognize that various features of the described examples may be combined. Moreover, aspects described in connection with an example may stand alone.

Although embodiments have been fully described with reference to the accompanying drawings, it should be noted that various changes and modifications will be apparent to those skilled in the art. Such changes and modifications are to be understood as being included within the scope of the various examples as defined by the appended claims.

What is claimed is:

1. A method for implanting ions into a work piece using an ion implantation system comprising an ion source, an extraction manipulator, a magnetic analyzer, and an electrode assembly, the method comprising:
    generating an ion beam by using the extraction manipulator to extract ions from the ion source, wherein a cross-section of the ion beam has a long dimension and a short dimension orthogonal to the long dimension of the ion beam;
    directing the ion beam through the magnetic analyzer, the magnetic analyzer configured to focus the ion beam in an x-direction parallel to the short dimension of the ion beam;
    accelerating or decelerating the ion beam through the electrode assembly, wherein one or more entrance electrodes of the electrode assembly defines a first opening, wherein the electrode assembly is positioned relative to the magnetic analyzer such that the ion beam converges in the x-direction as the ion beam enters through the first opening, and wherein the ion beam converges in the x-direction to a minimum width along the x-direction that is positioned within the electrode assembly; and
    positioning the work piece in the ion beam to implant ions into the work piece.

2. The method of claim 1, wherein the ion beam continuously converges along the x-direction as the ion beam travels from an exit of the magnetic analyzer to the entrance electrode of the electrode assembly.

3. The method of claim 1, wherein the ion source and the extraction manipulator are positioned relative to the magnetic analyzer such that the generated ion beam enters the magnetic analyzer at an angle of incidence of approximately 2-8 degrees relative to a central axis of the magnetic analyzer.

4. The method of claim 3, wherein the magnetic analyzer is configured to deflect the ion beam in a first direction, and wherein the ion beam is angled towards the first direction with respect to the central axis of the magnetic analyzer as the ion beam enters the magnetic analyzer.

5. The method of claim 1, wherein magnetic analyzer includes a yoke and the generated ion beam enters the magnetic analyzer through an opening of the yoke, and wherein the ion source and the extraction manipulator are configured such that at least approximately 90% of the generated ion beam is transmitted through the opening of the yoke.

6. The method of claim 5, wherein the ion beam diverges in a y-direction parallel to the long dimension of the ion beam as the ion beam enters through the opening of the yoke, and wherein a divergence angle of the ion beam in the y-direction is greater than approximately 2.5 degrees at the opening of the yoke.

7. The method of claim 1, wherein the one or more entrance electrodes of the electrode assembly are disposed at a first side of the electrode assembly, wherein the electrode assembly further comprises:
    a pair of exit electrodes disposed at a second side of the electrode assembly opposite to the first side of the electrode assembly, the pair of exit electrodes defining a second opening, wherein the pair of exit electrodes are positioned on opposite sides of a first plane aligned with a first dimension of the second opening; and
    a pair of Pierce electrodes adjacent to the pair of exit electrodes, the pair of Pierce electrodes positioned on opposite sides of a second plane aligned with a second dimension of the second opening, wherein:
        the second dimension of the second opening is perpendicular to the first dimension of the second opening;
        the pair of Pierce electrodes partially define a first ion beam path that extends from the first opening to the second opening;
        each Pierce electrode of the pair of Pierce electrodes has an angled surface facing the first ion beam path; and the angled surface of each Pierce electrode is positioned such that a first dimension of the angled surface of each Pierce electrode forms an angle of between approximately 40 and 80 degrees with respect to the second plane.

8. The method of claim 7, further comprising:
applying a voltage to the pair of Pierce electrodes, wherein the pair of Pierce electrodes generates an electric field along a boundary of the ion beam adjacent to the pair of Pierce electrodes to resist divergence of the ion beam between the pair of exit electrodes.

9. The method of claim 8, wherein the voltage applied to the pair of Pierce electrodes is between approximately 0.5 kV and 10 kV or between −0.5 kV and −10 kV.

10. The method of claim 7, wherein the pair of Pierce electrodes is configured such that the first ion beam path gradually narrows between the pair of Pierce electrodes towards the second opening.

11. The method of claim 7, wherein the pair of Pierce electrodes is positioned such that a second dimension of the angled surface of each Pierce electrode forms an angle of between approximately 35 and 65 degrees with respect to the first plane, and wherein the second dimension of the angled surface is perpendicular to the first dimension of the angled surface.

12. An ion beam implantation system for implanting ions into a work piece, the system comprising:
an ion source;
an extraction manipulator configured to generate an ion beam by extracting ions from the ion source, wherein a cross-section of the ion beam has a long dimension and a short dimension orthogonal to the long dimension of the ion beam;
a magnetic analyzer configured to focus the ion beam in an x-direction parallel to the short dimension of the ion beam; and
an electrode assembly configured to accelerate or decelerate the ion beam, wherein one or more entrance electrodes of the electrode assembly define a first opening, and wherein the electrode assembly is positioned relative to the magnetic analyzer such that the ion beam converges in the x-direction as the ion beam enters through the first opening and continues to converge in the x-direction to a minimum width along the x-direction within the electrode assembly.

13. The system of claim 12, wherein the electrode assembly is positioned relative to the magnetic analyzer such that the ion beam continuously converges along the x-direction as the ion beam travels from an exit of the magnetic analyzer to the one or more entrance electrodes of the electrode assembly.

14. The system of claim 12, wherein:
the electrode assembly further comprises a first set of electrodes configured to deflect the ion beam;
the one or more entrance electrodes and the first set of electrodes define a first portion of a first ion beam path in the electrode assembly; and
the electrode assembly is positioned relative to the magnetic analyzer such that the ion beam converges to a focal point along the first portion of the first ion beam path.

15. The system of claim 14, wherein the ion beam follows a linear trajectory from the first opening to the focal point.

16. The system of claim 14, wherein an exit electrode of the electrode assembly defines a second opening and the first ion beam path extends from the first opening to the second opening through the electrode assembly.

17. The system of claim 16, wherein the electrode assembly further comprises a second set of electrodes configured to deflect the ion beam, the second set of electrodes defining a second portion of the first ion beam path between the first set of electrodes and the second opening.

18. The system of claim 14, wherein the first ion beam path has an S-shaped trajectory.

19. The system of claim 12, further comprising a first multipole magnet positioned between the magnetic analyzer and the electrode assembly.

20. The system of claim 19, further comprising a variable aperture assembly positioned between the magnetic analyzer and the first multipole magnet.

21. The system of claim 19, further comprising:
a work piece support structure configured to position the work piece in the ion beam to implant ions into the work piece; and
a second multipole magnet positioned between the electrode assembly and the work piece support structure.

22. The system of claim 12, wherein a long dimension of the first opening is at least twice as long as a short dimension of the first opening.

23. An ion beam implantation system for implanting ions into a work piece, the system comprising:
an ion source;
an extraction manipulator configured to generate an ion beam by extracting ions from the ion source, wherein a cross-section of the ion beam has a long dimension and a short dimension orthogonal to the long dimension of the ion beam;
a magnetic analyzer configured to focus the ion beam in an x-direction parallel to the short dimension of the ion beam, wherein the ion source and the extraction manipulator are positioned relative to the magnetic analyzer such that the generated ion beam enters the magnetic analyzer at an angle of incidence of approximately 2-8 degrees relative to a central axis of the magnetic analyzer;
an electrode assembly configured to accelerate or decelerate the ion beam; and
a work piece support structure configured to position the work piece in the ion beam to implant ions into the work piece.

24. The system of claim 23, wherein one or more entrance electrodes of the electrode assembly define a first opening, and wherein the electrode assembly is positioned relative to the magnetic analyzer such that the ion beam converges in the x-direction as the ion beam enters through the first opening.

25. The system of claim 24, wherein the electrode assembly is positioned relative to the magnetic analyzer such that a focal point of the ion beam is positioned within the electrode assembly.

26. The system of claim 23, wherein the magnetic analyzer is configured to deflect the ion beam in a first direction, and wherein the ion beam is angled towards the first direction with respect to the central axis of the magnetic analyzer as the ion beam enters the magnetic analyzer.

27. The system of claim 23, wherein the ion source comprises an arc chamber and a faceplate, wherein an exit aperture of the faceplate has a long dimension and a short dimension, and wherein a long dimension of the exit aperture is less than approximately 100 mm.

28. The system of claim 23, wherein the magnetic analyzer includes a yoke and the generated ion beam enters the magnetic analyzer through an opening of the yoke, and wherein the ion source and the extraction manipulator are configured such that at least approximately 90% of the generated ion beam is transmitted through the opening of the yoke.

29. The system of claim 28, wherein:
the yoke defines a channel through which the ion beam travels;
a height of the channel increases along a length of the channel; and
the height of the channel is parallel to the long dimension of the ion beam.

30. The system of claim 23, wherein the ion source and the extraction manipulator are configured such that the generated ion beam diverges in a y-direction parallel to the long dimension of the ion beam as the ion beam enters the magnetic analyzer, and wherein a divergence angle of the generated ion beam in the y-direction is greater than approximately 2.5 degrees as the ion beam enters the magnetic analyzer.

31. An ion beam implantation system for implanting ions into a work piece, the system comprising:
an ion source;
an extraction manipulator configured to generate an ion beam by extracting ions from the ion source;
an electrode assembly configured to accelerate or decelerate the ion beam, the electrode assembly comprising:
one or more entrance electrodes disposed at a first side of the electrode assembly, the one or more entrance electrodes defining a first opening;
a pair of exit electrodes disposed at a second side of the electrode assembly opposite to the first side, the pair of exit electrodes defining a second opening, wherein the pair of exit electrodes are position on opposite sides of a first plane aligned with a first dimension of the second opening;
a pair of Pierce electrodes adjacent to the pair of exit electrodes, the pair of Pierce electrodes positioned on opposite sides of a second plane aligned with a second dimension of the second opening, wherein:
the second dimension of the second opening is perpendicular to the first dimension of the second opening;
the pair of Pierce electrodes partially define a first ion beam path that extends from the first opening to the second opening;
each Pierce electrode of the pair of Pierce electrodes has an angled surface facing the first ion beam path; and
the angled surface of each Pierce electrode is positioned such that a first dimension of the angled surface of each Pierce electrode forms an angle of between approximately 40 and 80 degrees with respect to the second plane; and
a work piece support structure configured to position the work piece in the ion beam to implant ions into the work piece.

32. The system of claim 31, wherein the pair of Pierce electrodes is positioned such that a second dimension of the angled surface of each Pierce electrode forms an angle of between approximately 35 and 65 degrees with respect to the first plane, and wherein the second dimension of the angled surface is perpendicular to the first dimension of the angled surface.

33. The system of claim 31, wherein the pair of Pierce electrodes is configured such that the first ion beam path gradually narrows between the pair of Pierce electrodes toward the second opening.

34. The system of claim 31, wherein the first ion beam path has an S-shaped trajectory through the electrode assembly.

35. The system of claim 31, wherein the electrode assembly further comprises a first set of electrodes configured to deflect the ion beam a first amount with respect to the first plane as the ion beam travels along the first ion beam path from the one or more entrance electrodes to the pair of Pierce electrodes.

36. The system of claim 35, wherein the electrode assembly further comprises a second set of electrodes configured to deflect the ion beam a second amount with respect to the first plane as the ion beam travels along the first ion beam path from the first set of electrodes to the pair of exit electrodes.

37. The system of claim 31, wherein the pair of Pierce electrodes is configured to apply an electric field along a boundary of the ion beam, and wherein the electric field resists divergence of the ion beam as the ion beam travels between the pair of exit electrodes.

38. The system of claim 31, wherein the one or more entrance electrodes further define a third opening, wherein a second ion beam path of the electrode assembly extends from the third opening to the second opening, and wherein the third opening is aligned with respect to the second opening such that the second ion beam path has a straight trajectory that is approximately parallel to the first plane.

39. The method of claim 1, wherein the ion beam diverges in the x-direction as the ion beam proceeds from the minimum width.

40. The system of claim 12, wherein the ion beam diverges in the x-direction as the ion beam proceeds from the minimum width.

* * * * *